United States Patent
Wang et al.

(10) Patent No.: US 12,439,580 B2
(45) Date of Patent: Oct. 7, 2025

(54) SEMICONDUCTOR MEMORY CELL STRUCTURE, SEMICONDUCTOR MEMORY, PREPARATION METHOD AND APPLICATION THEREOF

(71) Applicants: Beijing Superstring Academy of Memory Technology, Beijing (CN); INSTITUTE OF MICROELECTRONICS, CHINESE ACADEMY OF SCIENCES, Beijing (CN)

(72) Inventors: Qi Wang, Beijing (CN); Huilong Zhu, Beijing (CN)

(73) Assignees: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 10 days.

(21) Appl. No.: 17/770,856

(22) PCT Filed: Dec. 9, 2021

(86) PCT No.: PCT/CN2021/136853
§ 371 (c)(1),
(2) Date: Jun. 8, 2023

(87) PCT Pub. No.: WO2023/097743
PCT Pub. Date: Jun. 8, 2023

(65) Prior Publication Data
US 2024/0147686 A1    May 2, 2024

(30) Foreign Application Priority Data

Dec. 1, 2021    (CN) .......................... 202111456087.X

(51) Int. Cl.
| | | |
|---|---|---|
| *H10B 12/00* | (2023.01) | |
| *H10D 30/01* | (2025.01) | |
| *H10D 30/67* | (2025.01) | |

(52) U.S. Cl.
CPC .......... *H10B 12/00* (2023.02); *H10D 30/0321* (2025.01); *H10D 30/6733* (2025.01); *H10D 30/6755* (2025.01); *H10D 30/6757* (2025.01)

(58) Field of Classification Search
CPC .............. H10B 12/00; H10D 30/0321; H10D 30/6733; H10D 30/6755; H10D 30/6757; H10D 30/6728; H10D 88/00
See application file for complete search history.

(56) References Cited

U.S. PATENT DOCUMENTS

2016/0204117 A1   7/2016   Liu et al.
2016/0336329 A1*   11/2016   Colinge ................. H10D 88/00
(Continued)

FOREIGN PATENT DOCUMENTS

| CN | 106158867 A | 11/2016 |
|---|---|---|
| CN | 109300874 A | 2/2019 |

(Continued)

OTHER PUBLICATIONS

International Search Report dated Aug. 25, 2022 received in International Application No. PCT/CN2021/136853.

(Continued)

*Primary Examiner* — Mohammad A Rahman
(74) *Attorney, Agent, or Firm* — Scully, Scott, Murphy & Presser, P.C.

(57) ABSTRACT

The present invention relates to a semiconductor memory cell structure, a semiconductor memory as well as preparation method and application thereof. The semiconductor memory cell structure includes: a substrate; and a first transistor layer, an isolation layer and a second transistor layer. The first transistor layer includes a first stack structure formed by stacking a first source, a first channel, and a first drain from bottom to top; and a first gate located on a sidewall of the first stack structure. The second transistor layer includes: a second stack structure formed by stacking a second drain, a second channel, and a second source from bottom to top; and a second gate located on a sidewall of the second stack structure, at least a part of a sidewall of the second drain is in direct contact with the first gate. The present invention provides a 2T0C type DRAM cell with an improved structure, has the advantages of vertical stack (Continued)

integration, high integration level, low leakage current, short refresh time and the like, and is significantly superior to the existing 2T0C type DRAM.

23 Claims, 26 Drawing Sheets

(56) References Cited

U.S. PATENT DOCUMENTS

2020/0105891 A1  4/2020  Lilak et al.
2020/0328127 A1  10/2020  Yamashita et al.

FOREIGN PATENT DOCUMENTS

| CN | 109449121 A | 3/2019 |
| CN | 113284898 A | 8/2021 |
| CN | 113488504 A | 10/2021 |
| CN | 116761423 A | 9/2023 |

OTHER PUBLICATIONS

First Office Action dated Oct. 31, 2024 received in Chinese Patent Application No. 202111456087.X.

\* cited by examiner

SEMICONDUCTOR MEMORY CELL STRUCTURE, SEMICONDUCTOR MEMORY, PREPARATION METHOD AND APPLICATION THEREOF

TECHNICAL FIELD

The present invention relates to the field of semiconductor memory, and in particular to a semiconductor memory cell structure, a semiconductor memory as well as preparation method and application thereof.

BACKGROUND

A higher level of integration of semiconductor devices may be desirable, so as to meet consumer's demand for superior performance and low price. For semiconductor devices, since their integration level can be an important factor in determining the price of product, an increase in the integration level would be particularly desired. For two-dimensional or planar semiconductor devices, since their integration level is mainly determined by the area occupied by a unit memory cell, the integration level is greatly affected by the level of fine pattern forming technology. However, extremely expensive process equipment for increasing pattern fineness will place practical limitations on the increase of the integration level of two-dimensional or planar semiconductor devices. In order to overcome such limitations, three-dimensional semiconductor memory devices including three-dimensionally arranged memory cells have been proposed. 3D integration is a breakthrough in DRAM scaling, but the need for storage capacitors has limited the scalability of 3D DRAM cells.

SUMMARY

A main object of the present invention is to provide a semiconductor memory cell structure and a semiconductor memory composed thereof, which belongs to a 2T0C type DRAM cell with an improved structure, has the advantages of vertical stack integration, high integration level, low leakage current, short refresh time and the like, and is significantly superior to the existing 2T0C type DRAM.

Another object of the present invention is to provide a preparation method for a semiconductor memory cell structure. The preparation method provides a feasible industrialized mass production process for the above semiconductor memory cell structure, and the prepared stack structure has good mechanical stability and electrical stability.

In order to achieve the above objects, the present invention provides the following technical solutions.

A first aspect of the present invention provides a semiconductor memory cell structure, which includes: a substrate; and a first transistor layer, an isolation layer and a second transistor layer that are vertically stacked on the substrate from bottom to top;

the first transistor layer includes: a first stack structure formed by stacking a first source, a first channel and a first drain from bottom to top; and a first gate located on a sidewall of the first stack structure; in which the first gate and the sidewall of the first stack structure are isolated by a gate dielectric layer, and the first gate and the substrate are isolated by the gate dielectric layer; and the second transistor layer includes: a second stack structure formed by stacking a second drain, a second channel and a second source from bottom to top; and a second gate located on a sidewall of the second stack structure; in which the second gate and the sidewall of the second stack structure are isolated by the gate dielectric layer, at least a part of a sidewall of the second drain is in direct contact with the first gate, and the first gate and the second gate are isolated by a dielectric material in a vertical direction.

A second aspect of the present invention provides a semiconductor memory, which includes a plurality of the semiconductor memory cell structures described above, and the plurality of the semiconductor memory cell structures are electrically connected.

A third aspect of the present invention provides a preparation method for a semiconductor memory cell structure, which includes the following steps:

providing a substrate;

forming a first electrode material layer, a first sacrificial layer, a second electrode material layer, a second sacrificial layer, a third electrode material layer, a third sacrificial layer, a fourth electrode material layer and a mask layer by stacking vertically on the substrate in sequence;

patterning the mask layer to form an array including a plurality of mask units;

forming a mask spacer on a sidewall of each mask unit;

removing structures that are not shielded by the mask units and their spacers by etching until the substrate is exposed, thereby forming a stack structure on the substrate;

then etching the first sacrificial layer, the second sacrificial layer and the third sacrificial layer in one step or step by step, so that all the three layers are partially etched from a sidewall direction, and a plurality of grooves are formed on a sidewall of the stack structure;

filling the grooves on a sidewall of the second sacrificial layer with a dielectric material to form an isolation layer for upper and lower devices, the upper device being located above the isolation layer, and the lower device being located below the isolation layer;

filling the grooves on a sidewall of the first sacrificial layer and a sidewall of the third sacrificial layer respectively with a channel material to form a first channel layer and a second channel layer respectively;

removing the mask units and the stack structure covered by them by etching, until the substrate is exposed, and retaining the structure covered by the mask spacers, so as to be divided into two structural units covered by the mask spacers;

then removing the remaining first sacrificial layer, second sacrificial layer, third sacrificial layer and mask spacers;

forming a gate dielectric layer on the sidewall of each of the structural units;

etching the gate dielectric layer to expose at least part of the sidewall of the third electrode material layer in each of the structural units;

then forming a first gate layer on the sidewalls of the first electrode material layer, the first channel layer and the second electrode material layer and all upper surfaces of the structural units, in which the first gate layer contacts the exposed sidewall of the third electrode material layer;

forming one or more layers of dielectric film on an upper surface of the first gate layer;

forming a second gate layer on the dielectric films, in which the second gate layer covers a sidewall of the second channel layer.

A fourth aspect of the present invention provides the application of the above semiconductor memory cell structure, semiconductor memory, or the structure prepared by the above preparation method in an electronic device.

As compared with the prior art, the present invention achieves the following technical effects:

(1) a new structure of DRAM array with two vertically stacked devices is developed, which is a 2T0C type, eliminates the need for capacitors, and has the advantages of high integration level, low leakage current, and short refresh time, etc.;

(2) A wide range of channel materials are suitable for the semiconductor memory cell structure of the present invention, which can be silicon, or large Eg band gap materials or IGZO thin film transistor materials, etc.;

(3) the preparation method for the above semiconductor memory cell structure is also developed, which provides industrial feasibility for the promotion of the product, and the steps involved can be carried out under conventional conditions, resulting in low process difficulty;

(4) the arrangement of word lines and bit lines of the device composed of the above semiconductor memory cell structure, and the implementation of metal interconnection are also developed.

BRIEF DESCRIPTION OF THE DRAWINGS

Various other advantages and benefits will become apparent to those skilled in the art upon reading the following detailed description of preferred embodiments. The drawings are provided for the purpose of illustrating the preferred embodiments only, and should not be considered as limiting the present invention.

DETAILED DESCRIPTION

Hereinafter, embodiments of the present invention will be described with reference to the accompanying drawings. However, it should be understood that these descriptions are exemplary only, and are not intended to limit the scope of the present invention. In addition, in the following description, descriptions of well-known structures and techniques are omitted to avoid unnecessarily obscuring the concepts of the present disclosure.

Various schematic structural views according to the embodiments of the present disclosure are shown in the accompanying drawings. The figures are not drawn to scale, in which some details have been exaggerated for clarity, and some details may have been omitted. The shapes of the various regions and layers shown in the figures, as well as their relative sizes and positional relationships are only exemplary; in practice, there may be deviations due to manufacturing tolerances or technical limitations, and those skilled in the art can additionally design regions/layers with different shapes, sizes and relative positions as required.

In the context of the present disclosure, when a layer/element is referred to as being located "on" another layer/element, it can be directly located on said another layer/element, or intervening layers/elements may be present therebetween. element. In addition, if a layer/element is located "on" another layer/element in one orientation, then when the orientation is reversed, the layer/element may be located "below" said another layer/element.

The 2T0C DRAM cell in the prior art typically uses two horizontal-channel TFTs for connection on the same plane, which occupies a large area and is not advantageous for improving the integration density.

Figure 1:
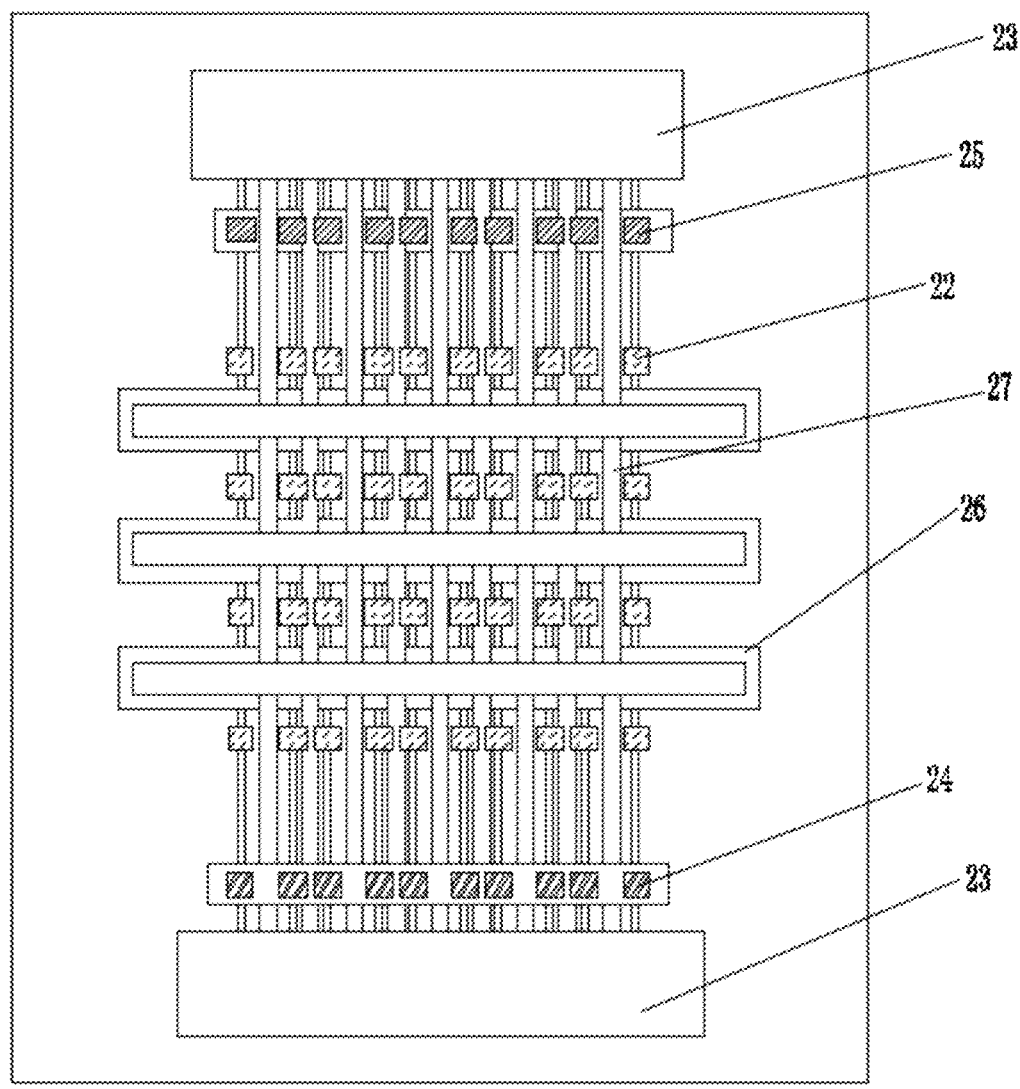
FIG. 1 is a top view of a DRAM structure provided by the present invention.
Figure 2:
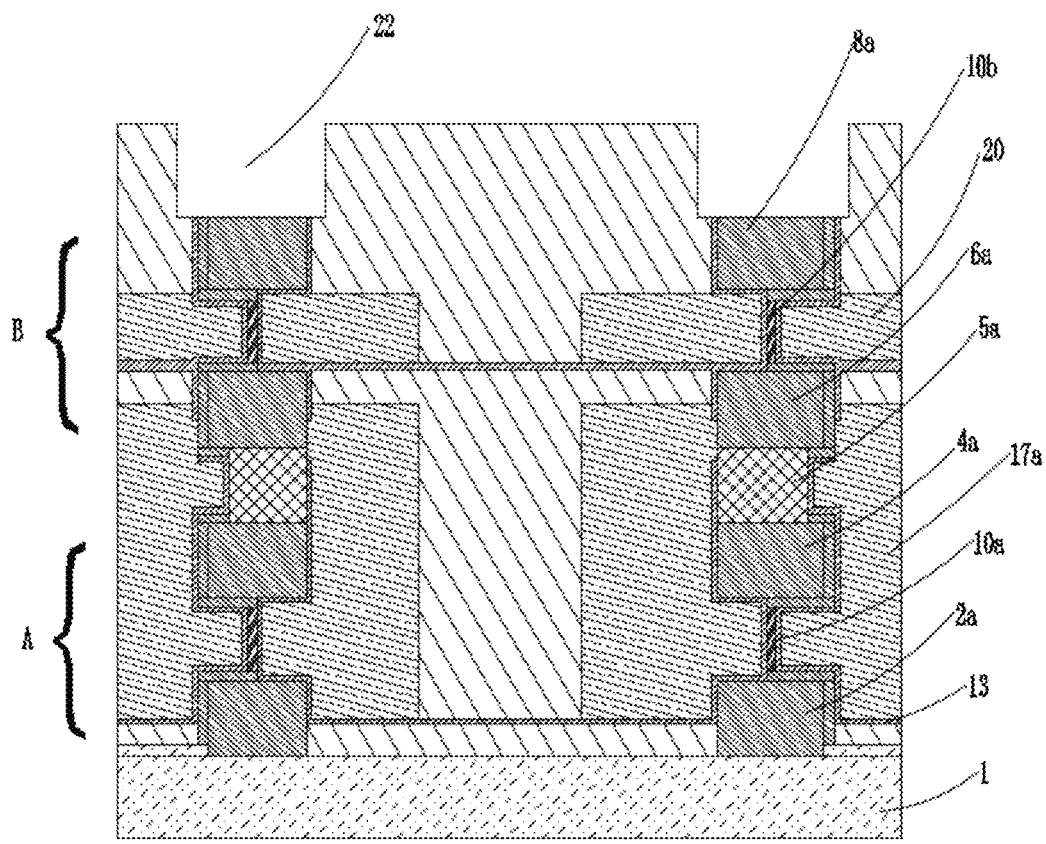
FIG. 2 is a section view of the DRAM structure provided by the present invention.

Therefore, the present invention provides a dual-device capacitor-less DRAM cell structure as shown in FIGS. 1 and 2, which can be functionally divided into three regions from bottom to top: a substrate 1, a first transistor layer A and a second transistor layer B, which will be specifically described as follows.

The substrate 1 may be any substrate known to those skilled in the art for carrying components of a semiconductor integrated circuit, such as silicon-on-insulator (SOI), bulk silicon, silicon carbide, germanium, germanium-silicon, gallium arsenide, or germanium-on-insulator, etc., and the corresponding top semiconductor material is silicon, germanium, germanium-silicon or gallium arsenide, etc. At the same time, the doping type of the semiconductor layer on the substrate is determined according to the device type to form a p-well (for nMOSFET) or an n-well (for pMOSFET).

Taking an isolation layer 5a as the boundary, the first transistor layer A is located below the isolation layer 5a. This transistor layer adopts a vertically stacked structure, which includes a first stack structure formed by stacking a first source 2a, a first channel 10a and a first drain 4a from bottom to top, and a first gate 17a located on a sidewall of the first stack structure. In addition, the first gate 17a and the sidewall of the first stack structure are isolated by a gate dielectric layer 13, and the first gate 17a and the substrate 1 are isolated by the gate dielectric layer 13.

In the first transistor layer A, the source, the channel and the drain are vertically stacked, and the gate is located on the side of the stack. This structure implements the function of a reading transistor. In addition, in order to omit capacitors, the first gate 17a in the first transistor layer is used as a storage node, which is to be in direct contact with a second drain 6a of the second transistor layer, as shown in FIG. 2.

The second transistor layer B includes: a second stack structure formed by stacking a second drain 6a, a second channel 10b, and a second source 8a from bottom to top, and a second gate 20 located on a sidewall of the second stack structure. The second gate 20 and the sidewall of the second stack structure are isolated by the gate dielectric layer 13, at least a part of a sidewall of the second drain 6a is in direct contact with the first gate 17a, and the first gate 17a and the second gate 20 are isolated by a dielectric material in the vertical direction. The second transistor layer can implement the function of a writing transistor.

In both the first transistor layer A and the second transistor layer B, the channel is located between the source and the drain. In order to reduce the leakage current to a greater extent, the channel preferably has a smaller width, that is, a "C"-shaped channel is designed between the source and the drain, and the specific structure can be:

two opposite sidewalls of the first stack structure respectively have a groove profile, and the first channel 10a is located at the recession; and/or two opposite sidewalls of the second stack structure respectively have a groove profile, and the second channel 10b is located at the recession.

In addition, in the vertical direction, the isolation between the first gate 17a and the substrate 1 as well as the isolation between the first gate 17a and the second gate 20 are both preferably implemented by using multiple layers of dielectric material, such as a combination of oxide, nitride and a high-K material, preferably including at least a silicon oxide film and a high-K dielectric film.

The DRAM cell structure shown in FIG. 2 has the following two prominent characteristics.

Firstly, two layers of transistors are vertically stacked with no capacitors connected, which solves the problem of large occupied area of the planar channel 2T0C DRAM cell and improves the integration density.

Secondly, the channel has a recessed C-shape when viewed laterally, which can greatly reduce the leakage current problem.

Figure 3:
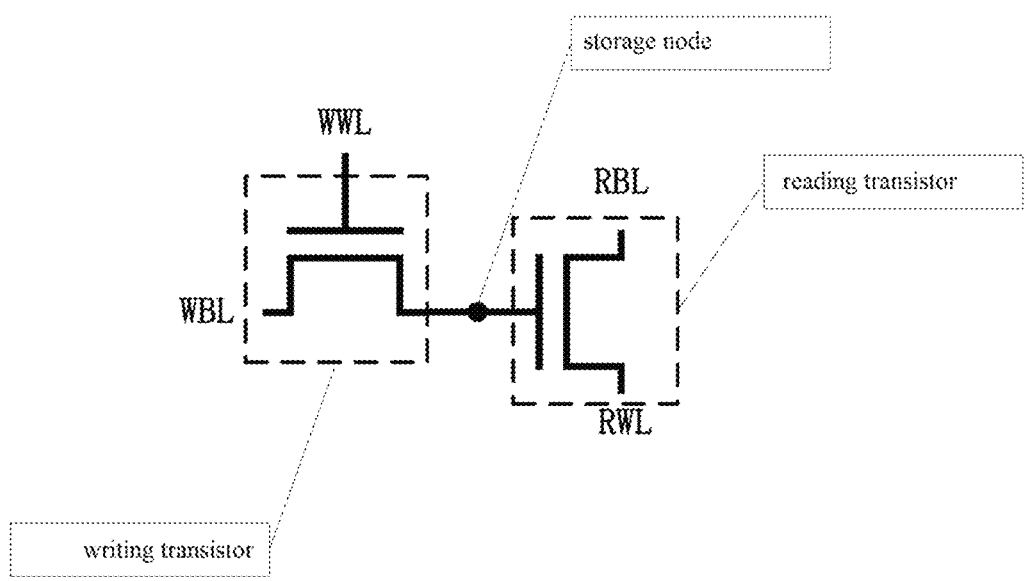
FIG. 3 is a schematic diagram illustrating a storage principle of the DRAM structure of the present invention.

The working principle of the DRAM cell structure described above in the present invention is shown in FIG. 3 (the positions of the transistors in the figure are shown only for facilitating illustrating the working principle, and do not represent the actual positional layout). The first transistor layer A is used as a reading transistor, the second transistor layer B is used as a writing transistor, and the gate of the former is in direct contact with the drain of the latter. Charges in a gate capacitor of the reading transistor are changed by the writing transistor, thereby affecting an impedance state between the source and the drain of the reading transistor, and realizing the distinction between "0" and "1". The specific principle is described as follows.

In the process of writing "1", a positive voltage (greater than a threshold voltage Vth) is applied to the gate electrode of the reading transistor (that is, writing word line WWL) to turn on the writing transistor, and a positive voltage is applied to the source of the writing transistor (that is, writing bit line WBL) to inject charges into the gate capacitor of the reading transistor (i.e., the storage node). After the charges are injected, the gate and source voltages of the writing transistor are removed, and the "1" state is saved.

In the process of reading "1", a reading voltage is applied to the drain of the reading transistor. Since there are certain charges in the gate capacitor, the reading transistor is in a lower impedance state, and a larger current is obtained; then the process of reading "1" is completed after amplification and identification by a peripheral circuit.

In the process of writing "0", a positive voltage (greater than the threshold voltage Vth) is applied to the gate electrode of the reading transistor (that is, writing word line WWL) to turn on the writing transistor, and a negative voltage is applied to the source of the writing transistor (that is, writing bit line WBL) to extract charges from the gate capacitor of the reading transistor (i.e., the storage node). After the charges are extracted, the gate and source voltages of the writing transistor are removed, and the "0" state is saved.

In the process of reading "0", a reading voltage is applied to the drain of the reading transistor. Since there is no charge in the gate capacitor, the reading transistor is in a higher impedance state, and a smaller current is obtained; then the process of reading "0" is completed after amplification and identification by a peripheral circuit.

In terms of material selection of the above cell structure, for each layer, any material that can realize a basic function of the layer can be used; however, in order to further improve the electrical performance and use effect of the memory, each layer has its own preferred material.

For example, the first channel 10a and the second channel 10b can be made of IGZO material. Since an off-state leakage current of the IGZO thin film transistor is very low, the information of the storage node can be kept for a long time.

The gate dielectric layer plays an insulating role between the gate and the channel, and it is preferably made of a material with a wide band gap and a high dielectric constant, or a material suitable for fabricating extremely small sized devices, such as $HfO_2$.

The first source 2a, the first drain 4a, the second source 6a, the second drain 8a, the first gate 17a and the second gate 20 are used as electrodes to be connected to a power supply, and they are preferably made of metal materials or doped semiconductor materials with good electrical conductivity. Considering the realizability of the process, the first gate 17a and the second gate 20 are preferably metal gates, which can be formed by sputtering, including but not limited to typical titanium nitride, tungsten and the like. In addition, considering the fast and stable current transfer between the electrodes, the two gates are preferably made of the same material. Typical materials such as doped silicon can be used for the first source 2a, the first drain 4a, the second source 6a, and the second drain 8a, and it is also preferable to use the same material for them.

For the isolation layer 5a for isolating the upper and lower devices, silicon oxide and silicon nitride are preferably used to facilitate large-area deposition, and silicon nitride is more preferred. A silicon nitride film is an amorphous film with strong resistance to sodium and water vapor, and it can play a good role in passivation and protection; moreover, the silicon nitride itself has good chemical stability, strong acid and alkali resistance, strong masking ability, and a high dielectric constant.

After the above capacitor-less DRAM cell structure forms a memory, the arrangement of various cells (i.e., an array of word lines and bit lines) and the metal interconnection structure can be adjusted adaptively or determined by the process. There are many methods for preparing the above capacitor-less DRAM cell structure, and for different methods, the process flows or the formation sequences of various structures are different. In this regard, the present invention provides one of the feasible methods, which has the characteristics of 3D integrated processing under normal conditions, and can realize the arrangement of word lines and bit lines more simply. With reference to FIGS. 4 to 42, the specific process will be described as follows.

Figure 4:
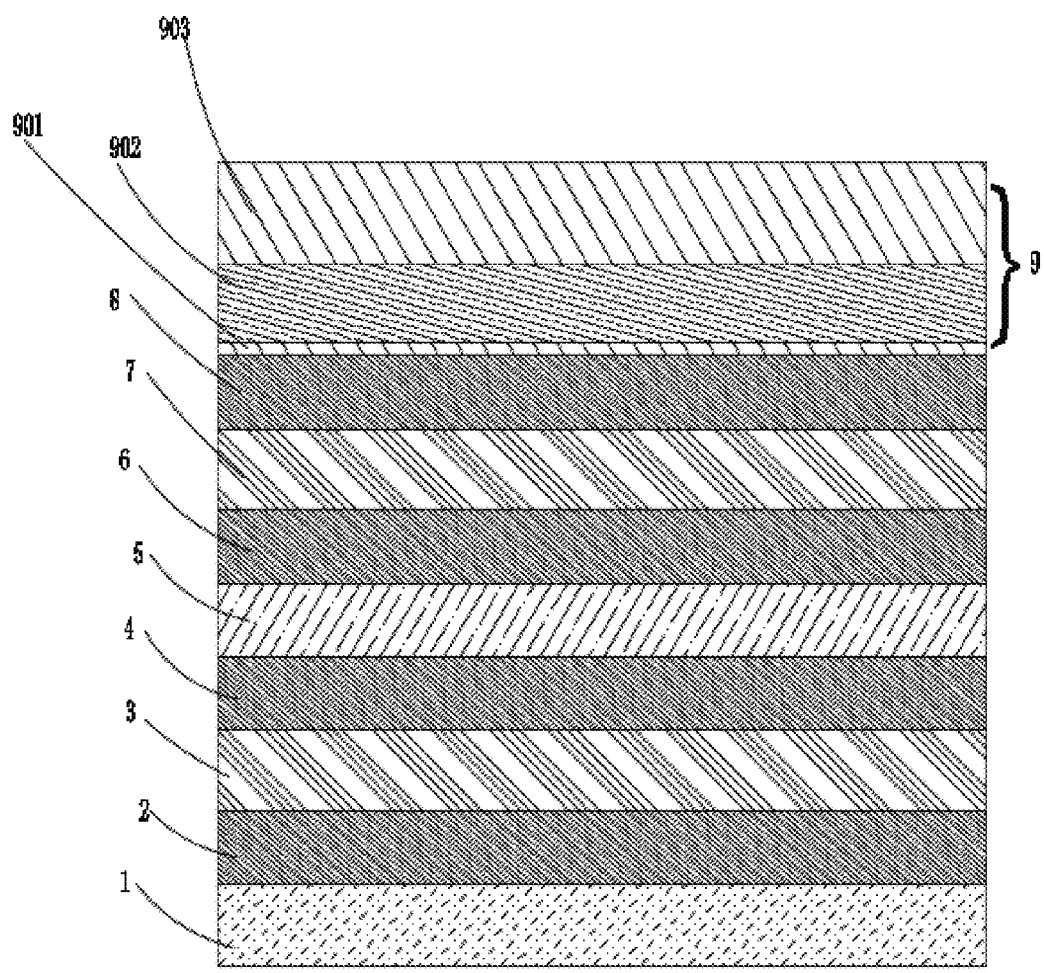
FIGS. 4 to 41 are schematic views of structures obtained in various steps of the preparation method provided by the present invention.
Figure 5:
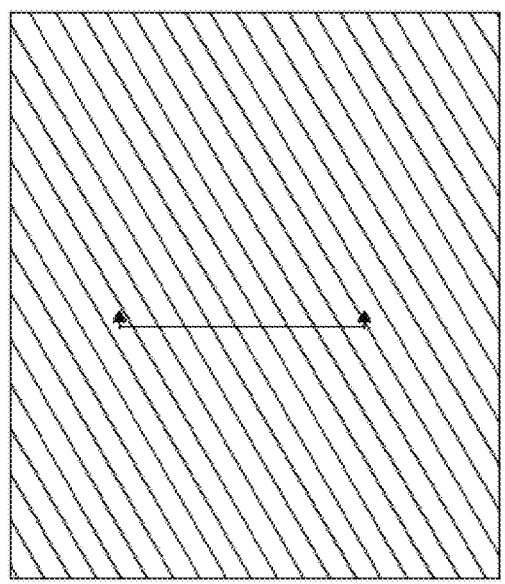

First, in step S1, a first electrode material layer 2, a first sacrificial layer 3, a second electrode material layer 4, a second sacrificial layer 5, a third electrode material layer 6, a third sacrificial layer 7, a fourth electrode material layer 8, and a mask layer 9 are formed by stacking vertically in sequence on the substrate 1, so as to obtain the morphology shown in FIG. 4, a top view of which is shown in FIG. 5 (the arrows in FIG. 5 indicate the sectional direction of FIG. 4).

The three sacrificial layers of the first sacrificial layer 3, the second sacrificial layer 5 and the third sacrificial layer 7 preoccupy positions for the later formation of the channels of two devices and the isolation layer between the two devices, so for them, it is necessary to select a material with a large difference in etching performance from the electrode material, such as germanium-silicon. At the same time, considering that the positions of the first sacrificial layer 3 and the third sacrificial layer 7 are the positions of the channels, the position of the second sacrificial layer 5 is the position of the isolation layer, and usually the required widths of the channels and the isolation layer are different, the first sacrificial layer 3 and the third sacrificial layer 7 are made of the same or similar materials, and the second sacrificial layer 5 is made of a material that is significantly different from those of the first two. For example, the first sacrificial layer 3, the second sacrificial layer 5 and the third sacrificial layer 7 are germanium-silicon layers with different germanium contents, in which molar contents of germanium are ≤15%, ≥30% and ≤15%, respectively.

The four electrode layers of the first electrode material layer 2, the second electrode material layer 4, the third electrode material layer 6 and the fourth electrode material layer 8 are used to subsequently form the drain and source of the lower transistor and the drain and source of the upper transistor respectively. The range of material selection of these electrodes is as described above. The role of the three sacrificial layers in another aspect is also to support the four electrode layers.

On one hand, the mask layer 9 is used to pattern the electrodes of each layer, and on the other hand, it serves to protect a top electrode during subsequent lateral etching. The mask layer 9 is preferably a hard mask (HM), such as TiN, SiN, SiO$_2$, amorphous silicon, etc. More preferably, the mask layer 9 is formed by stacking a silicon oxide layer 901, an amorphous silicon layer (α-Si) 902 and a silicon oxide layer 903 from bottom to top (as illustrated in FIG. 4).

According to the types of the materials of the above four electrode layers, three sacrificial layers and mask layer, an appropriate formation process is selected, which usually includes but is not limited to in-situ oxidation, PECVD, ALCVD, epitaxial growth, sputtering, and the like.

Figure 6:
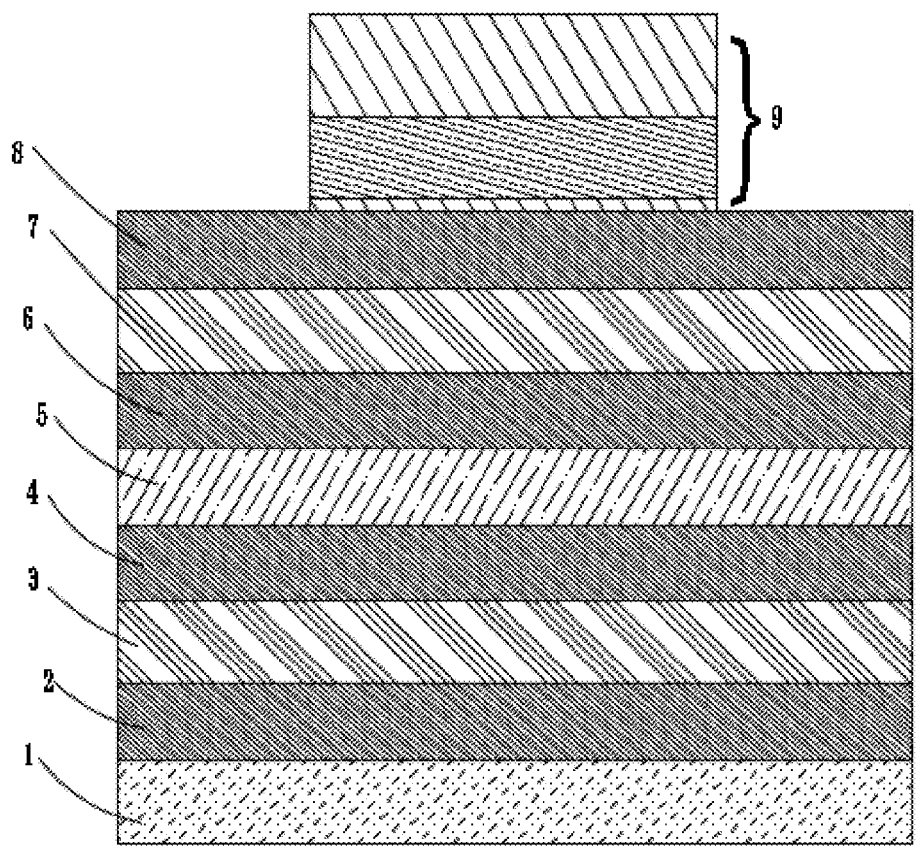
Figure 7:
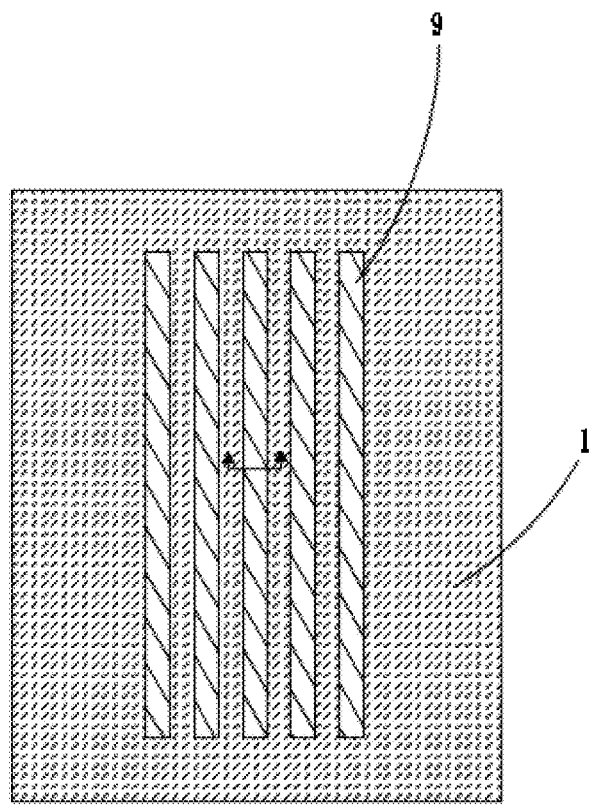
Figure 8:
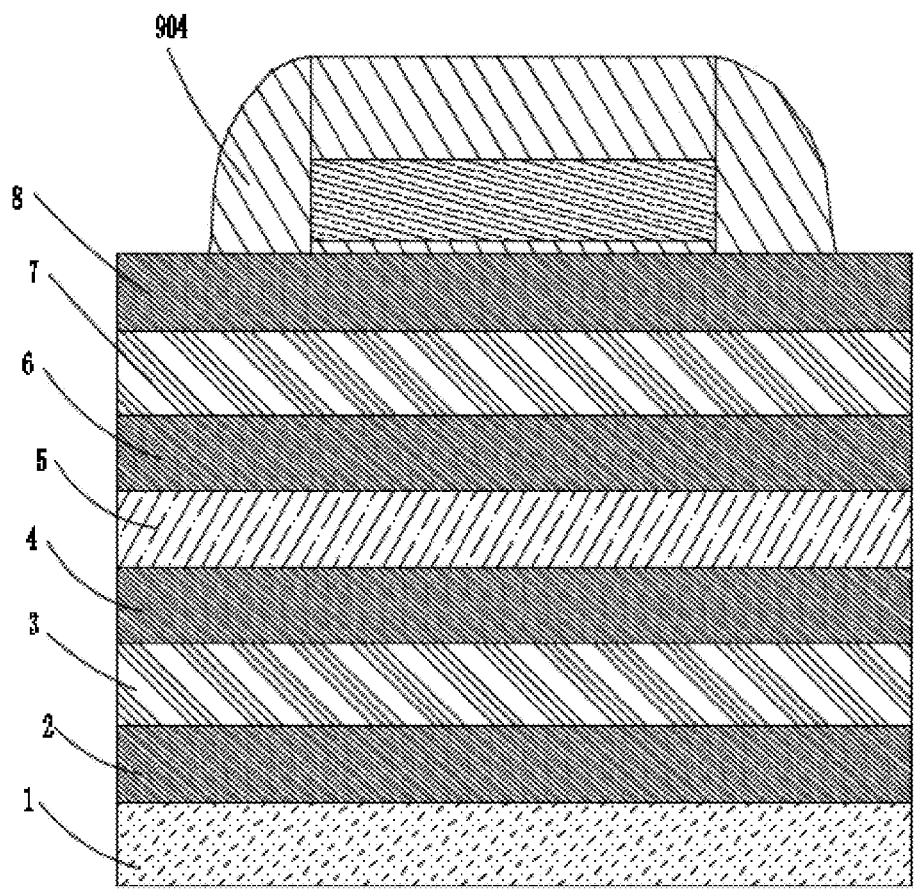

Next, in step S2, the mask layer 9 is patterned to form an array including a plurality of mask units, so as to obtain a morphology, a top view of which is shown in FIG. 6 (only five parallel units are shown in the figure, which does not limit the actual shape and number of array arrangement), and a sectional view of which is shown in FIG. 7 (in which one of the units in FIG. 6 is shown, and the sectional direction is shown by the arrows in FIG. 6).

The patterning of this step is usually achieved by combining photolithography and etching, and one-step or step-by-step etching can be determined according to the etchant or etching means (dry etching, wet etching, etc.).

Then, in step S3, a mask spacer 904 is formed on the sidewall of each mask unit. The mask spacer 904 is usually made of silicon oxide, silicon nitride, etc., and a width of the spacer is 30-100 nm. The mask spacer 904 stops on the surface of the fourth electrode material layer 8 to obtain the morphology shown in FIG. 8 (the silicon oxide spacer is used as an example in the figure). The formation means include, but are not limited to, in-situ oxidation, PECVD, ALCVD, CVD, and the like.

Figure 9:
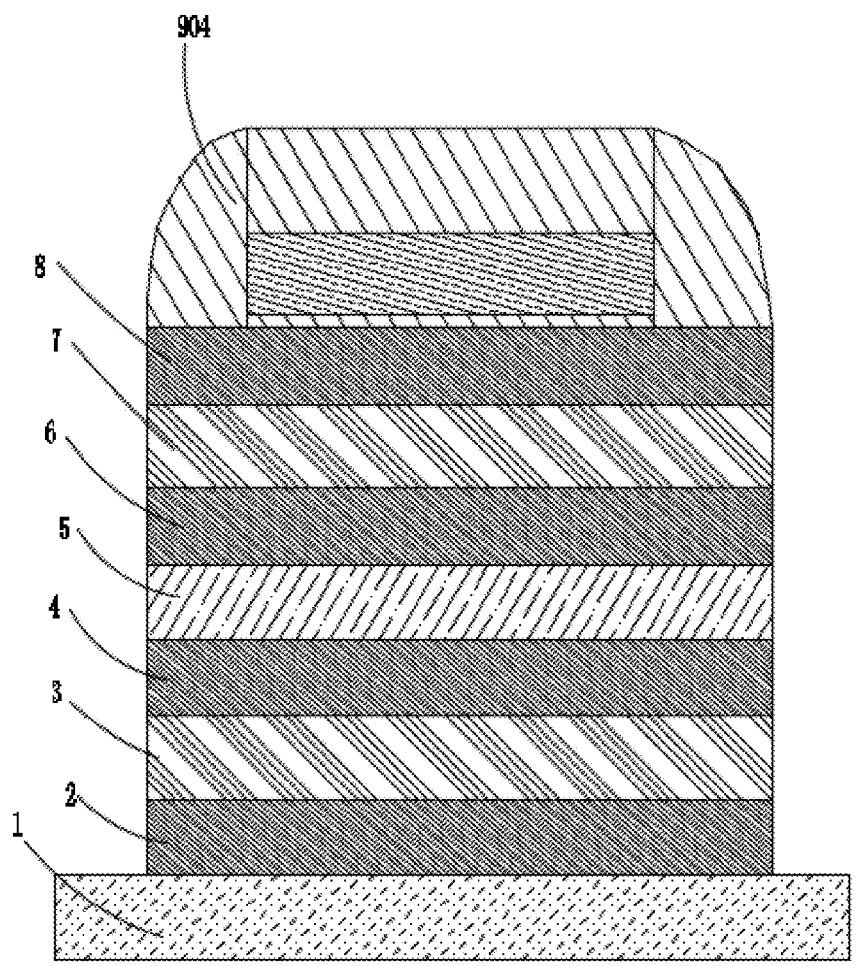
Figure 10:
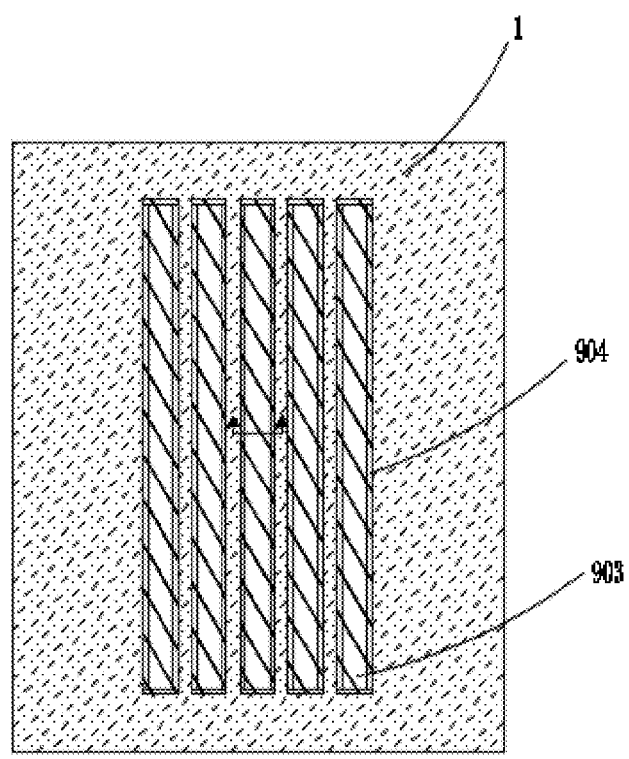
Figure 11:
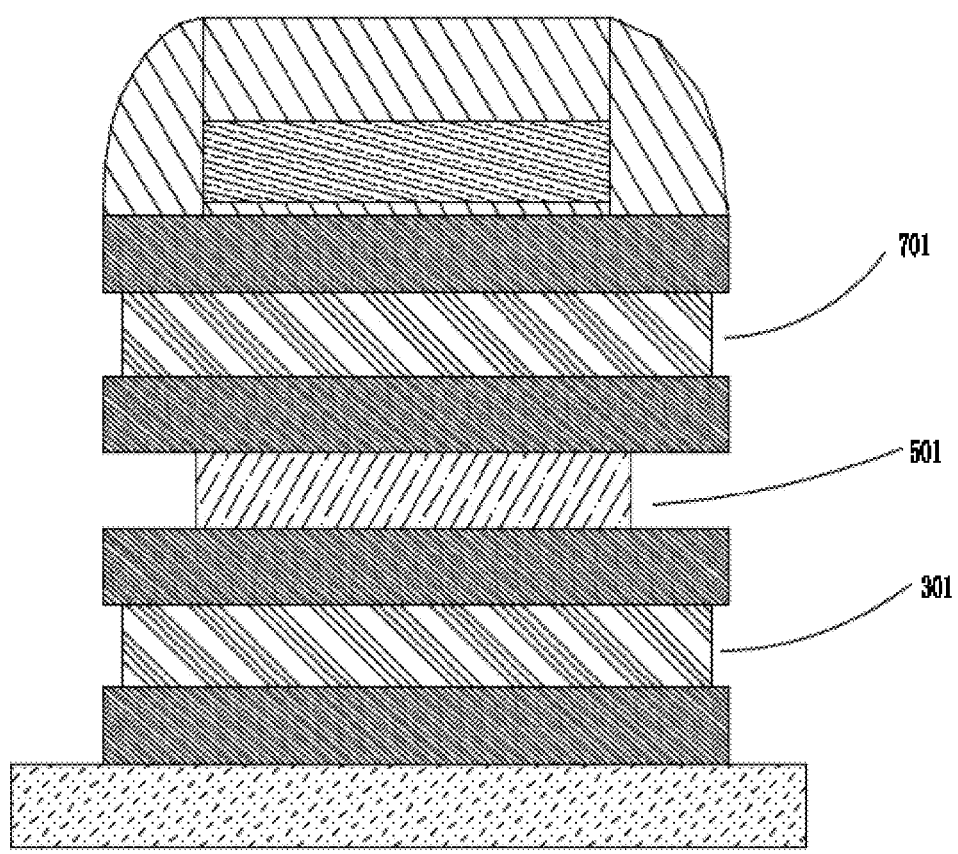

Next, in step S4, structures that are not shielded by the mask units and their spacers (i.e., the stack structures outside the array) are removed by etching until the substrate is exposed, thereby forming a stack structure on the substrate, as shown in FIGS. 9 and 10 (FIG. 10 is a top view, and FIG. 9 is a sectional structure in the direction indicated by the arrows in FIG. 10). Since multiple layers of material are etched in this step, different etching means and etchants can be used for step-by-step etching, which is not particularly limited in the present invention.

Then, in step S5, the first sacrificial layer, the second sacrificial layer and the third sacrificial layer are etched in one step or step-by-step, so that all the three layers are partially etched from the sidewall direction, thus forming a plurality of grooves 701, 501 and 301 on the sidewall of the stack structure. Depths of the grooves can be controlled to be in a range of 10-100 nm. In this step, lateral etching is performed along the sidewall, and it should be selective etching. In an example in which the first sacrificial layer, the second sacrificial layer and the third sacrificial layer are germanium-silicon layers with different germanium contents (the molar contents of germanium are ≤15%, ≥30% and ≤15%, respectively), the etching can be completed synchronously. Moreover, since the second sacrificial layer has high germanium content and has a high etching selectivity ratio, the depth of the groove 501 formed on the sidewall of the second sacrificial layer is deeper than the grooves 301 and 701 of the other two sacrificial layers. See the structure shown in FIG. 11.

In step S6, the groove 501 on the sidewall of the second sacrificial layer is filled with a dielectric material to form an isolation layer for the upper and lower devices, in which the upper device is located above the isolation layer, and the lower device is located below the isolation layer. As mentioned above, the isolation layer is preferably made of silicon nitride.

Since the situation of filling the dielectric material in the laterally opened grooves is more complicated, it usually needs to be carried out in multiple steps. For example, the following method can be adopted.

Figure 12:
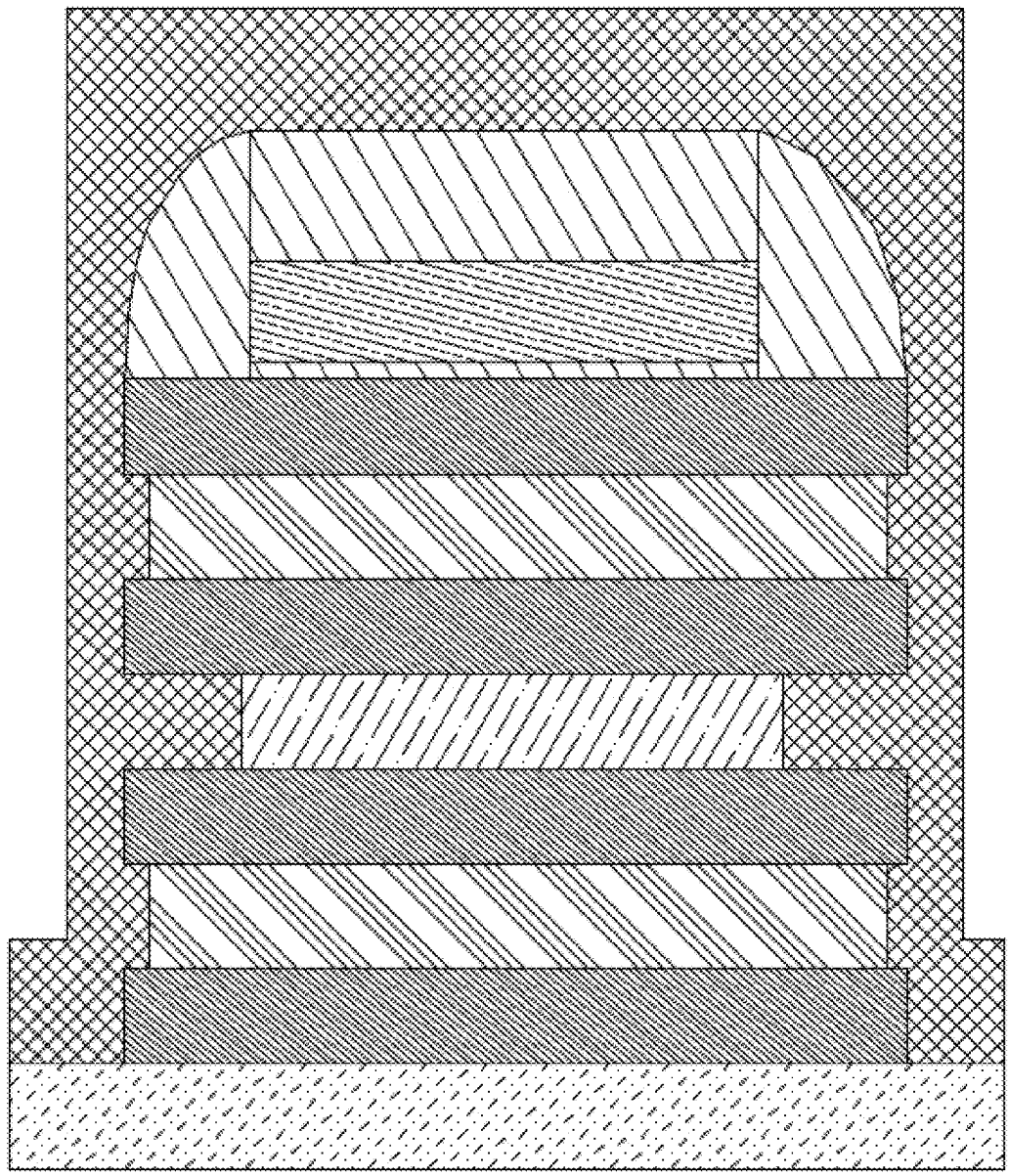

In step S601, a dielectric material such as silicon nitride is deposited to cover all outer surfaces, and the obtained structure is shown in FIG. 12.

Figure 13:
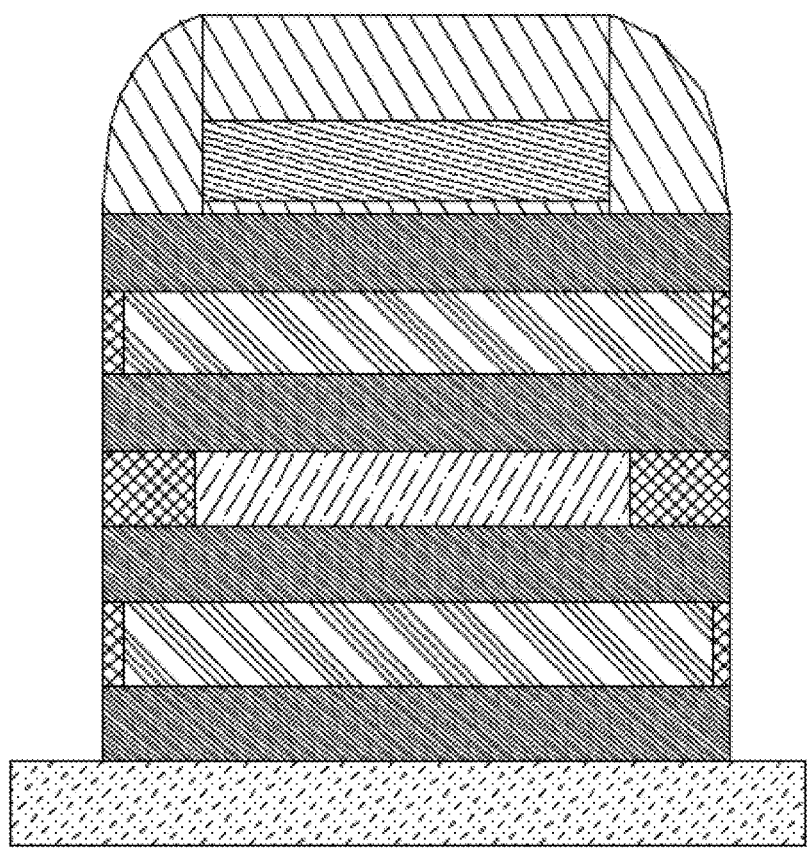

In step S602, the dielectric material located on all the top surfaces and the sidewalls is removed by etching, and the obtained structure is shown in FIG. 13.

Figure 14:
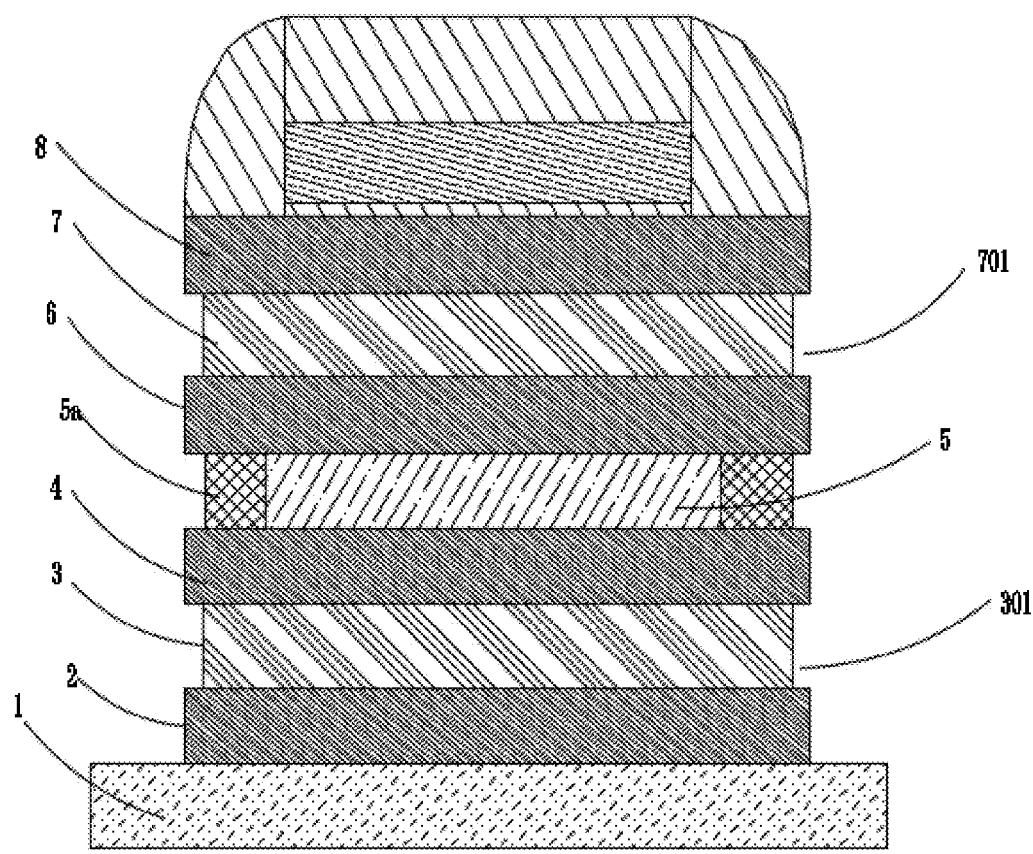

In step S603, the dielectric material located in the groove 301 on the sidewall of the first sacrificial layer 3 and the groove 701 on the sidewall of the third sacrificial layer 7 is completely removed. At this time, there is still dielectric material remaining in the groove on the sidewall of the second sacrificial layer 5, i.e., the isolation layer 5a, as shown in FIG. 14.

After that, step S7 is performed to fill the grooves on the sidewall of the first sacrificial layer and the sidewall of the third sacrificial layer with a channel material to form a first channel layer and a second channel layer, respectively.

This step has the same situation as step S6, i.e., both filling dielectric material in the laterally opened grooves, which is more complicated. Another problem is that the depths of the grooves on the sidewall of the first sacrificial layer and the sidewall of the third sacrificial layer may not be deep enough to support the channel material or to meet the width requirements on the channel. For the above two problems, the present invention provides the following feasible method, which is applicable to a situation in which the first electrode material layer, the second electrode material layer, the third electrode material layer, and the fourth electrode material layer are all epitaxial semiconductors (such as epitaxially doped silicon), the three sacrificial layers are all formed by the epitaxial method, and the top of the mask layer is silicon oxide.

Figure 15:
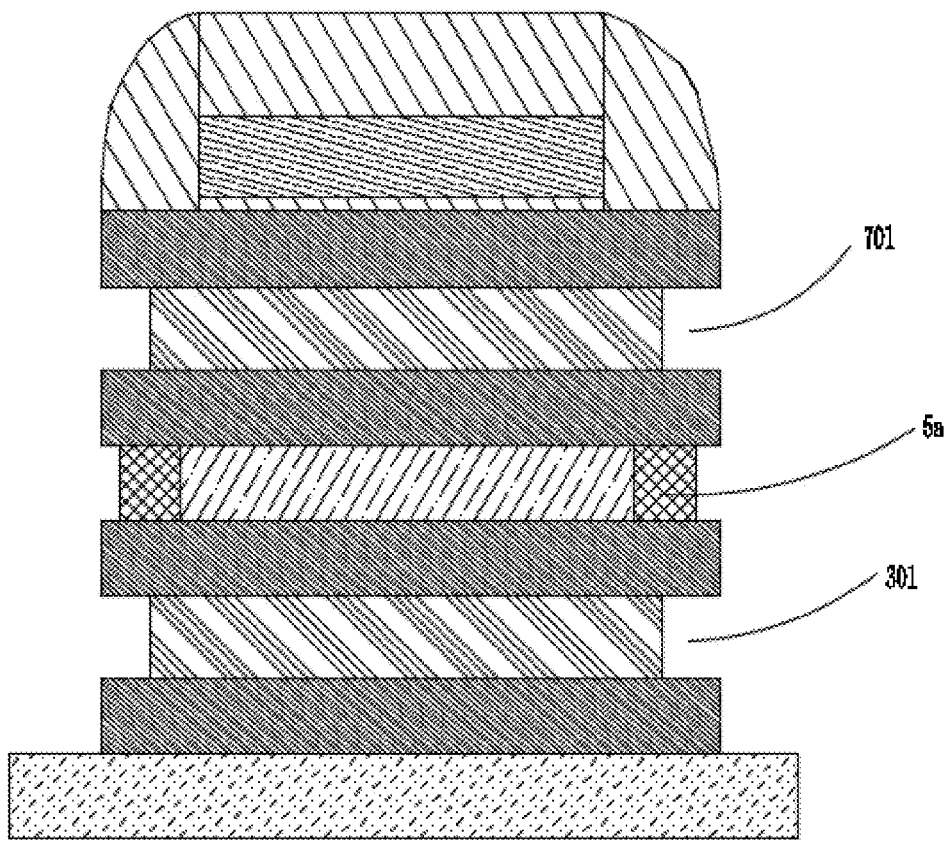

In step S701, the first sacrificial layer and the third sacrificial layer are selectively dry-etched laterally, and the depth of SiGe lateral etching is precisely controlled to make the grooves 301 and 701 deeper, as shown in FIG. 15.

Figure 16:
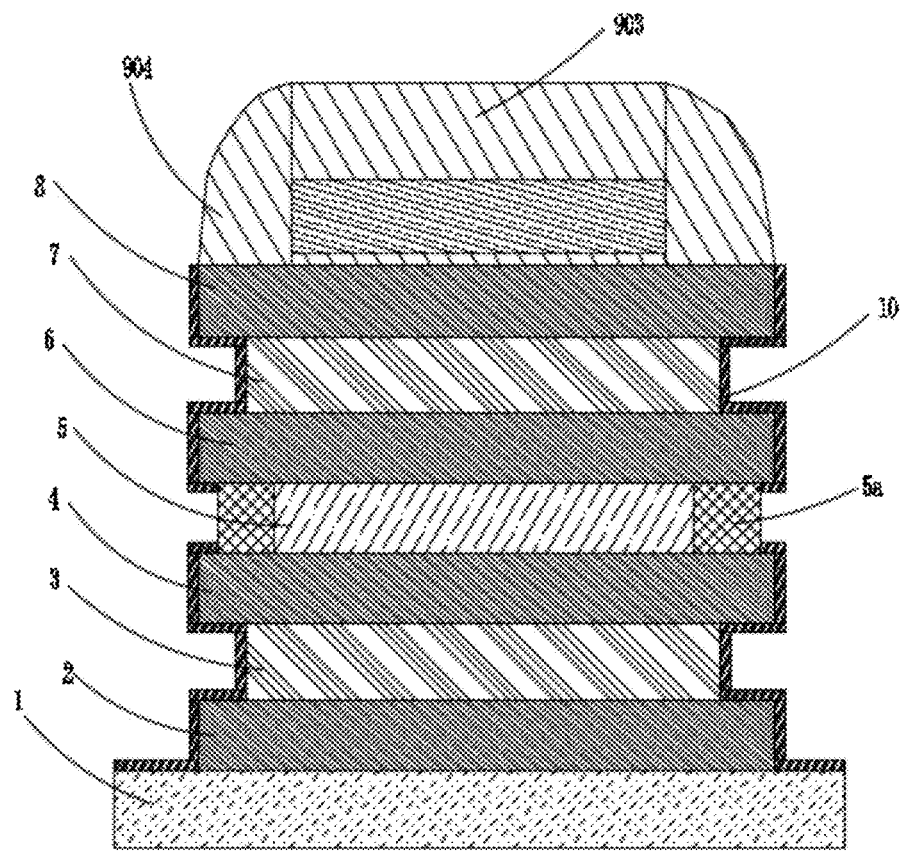
Figure 17:
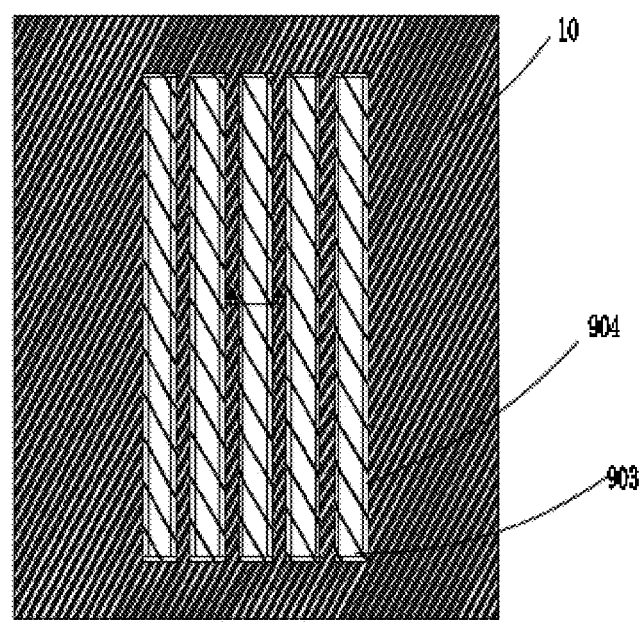

In step S702, an example is used in which silicon is used as the channel material and the electrode materials are epitaxially doped silicon. Since this step and the four electrode material layers are all formed by the epitaxial method and are all silicon, the crystal growth direction determines that the epitaxially grown channel material 10 in this step is only distributed on the sidewalls, as shown in FIG. 16 (the top view structure is shown in FIG. 17); at the same time, the isolation layer 5*a* at the second sacrificial layer is made of a material such as silicon nitride, so silicon material also cannot be epitaxially grown here.

In addition, since channel material layers are also epitaxially grown on the sidewalls of the first electrode material layer, the second electrode material layer, the third electrode material layer and the fourth electrode material layer in step S702, in order to avoid a larger leakage current problem, it is also necessary to process the channel materials on the sidewalls of the four electrode material layers, such as converting them into doped materials or removing them, that is, the following step S703.

In step S703, high-temperature annealing is performed on the first electrode material layer, the second electrode material layer, the third electrode material layer and the fourth electrode material layer (the high-temperature annealing can convert the channel materials on the sidewalls of the electrode material layers into doped materials, and since it is not easy to dope them by high-temperature annealing in the vertical direction, the channel materials on the sidewalls of the first sacrificial layer and the third sacrificial layer are not doped), or the epitaxial channel materials on the sidewalls of the first electrode material layer, the second electrode material layer, the third electrode material layer and the fourth electrode material layer are removed. The latter means in this step can be performed immediately after step S702, but the former means in this step can be completed in a subsequent process, that is, it does not need to be performed immediately after step S702 (this is also considering that silicon oxide needs to be filled to protect the electrode structure during the high-temperature annealing).

Figure 18:
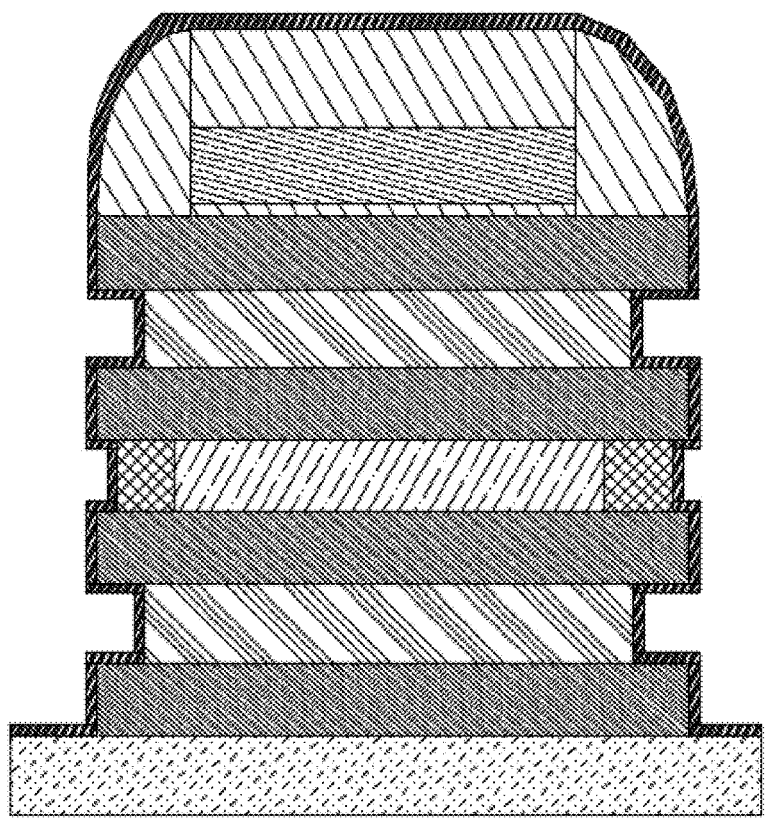
Figure 19:
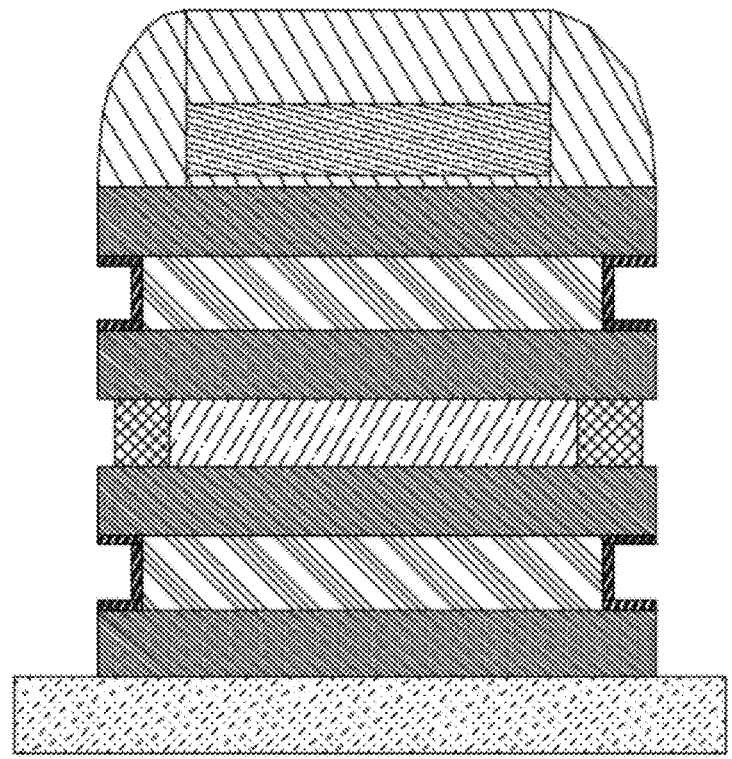

If the channel uses materials such as silicon carbide, gallium nitride, IGZO and the like as the channel, unlike the epitaxial silicon electrode, all the outer surfaces are covered with the channel material, thus forming the structure shown in FIG. 18. Then, selective etching is performed to remove the channel materials in the non-channel region (including all the top surfaces, the sidewalls of the four electrode layers, the sidewall of the isolation layer at the second sacrificial layer, and the sidewalls of the mask spacers) to obtain the structure shown in FIG. 19. This selective etching method can use the following process: first, a shielding layer such as silicon nitride is formed at the grooves of the first and second sacrificial layers for protection, then the channel materials in the non-channel region are removed, and then the shielding layer such as silicon nitride is removed (which will not be described in detail in conjunction with drawings).

The next steps are described by taking the silicon channel as an example.

Figure 20:
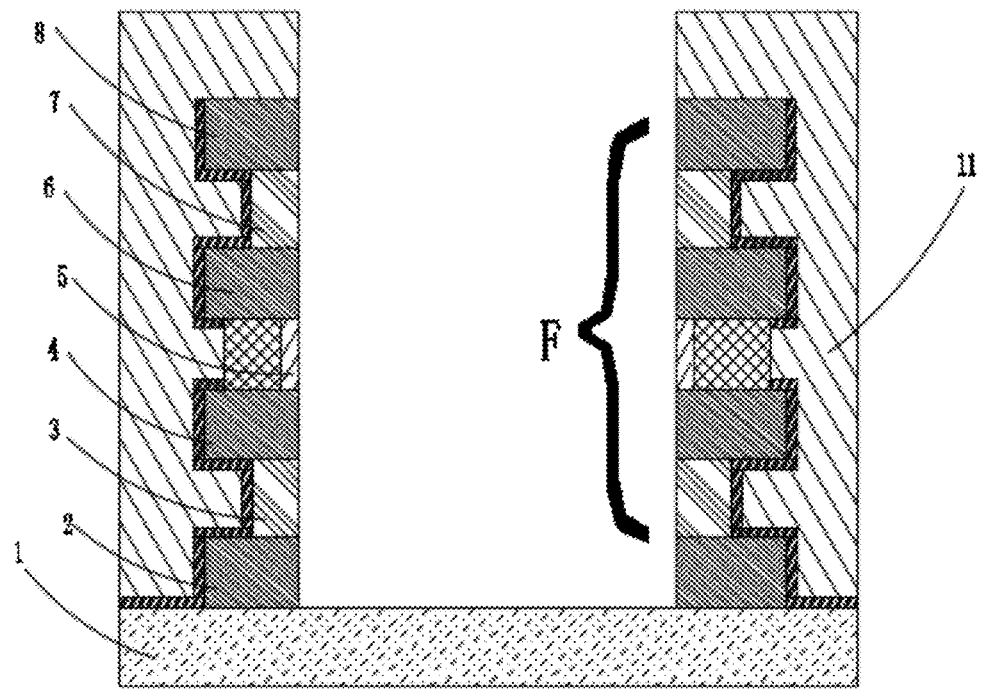

Then, step S8 is performed to remove the mask units and the stack structure covered by the mask units by etching until the substrate is exposed, and to retain the structure covered by the mask spacers, so as to be divided into two structural units F covered by the mask spacers (as shown in FIG. 20).

Before this step is performed, it is necessary to deposit a layer of oxide protective film such as silicon oxide. The specific steps are as follows (taking the silicon oxide protective film as an example).

In step S801, a layer of silicon oxide protective film 11 is deposited.

In step S802, remove the top-layer silicon oxide by polishing, etching and other means, and stop at the amorphous silicon layer.

In step S803, the amorphous silicon layer is removed by wet-etching with TMAH solution or other etching means.

Figure 21:
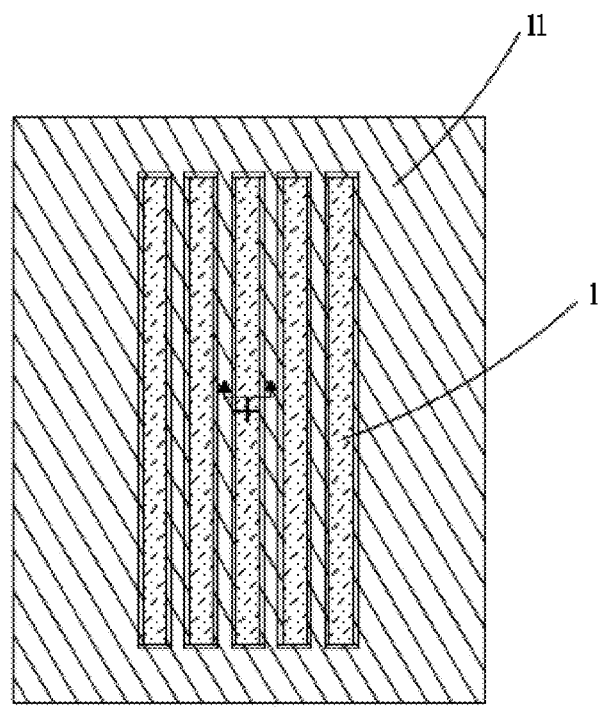

In step S804, the stack structure is dry-etched at the window formed after the amorphous silicon layer is removed, until the substrate is exposed, so as to obtain the structure shown in FIGS. 20 and 21 (the arrow direction in FIG. 21 is the sectional direction of FIG. 20).

Figure 22:
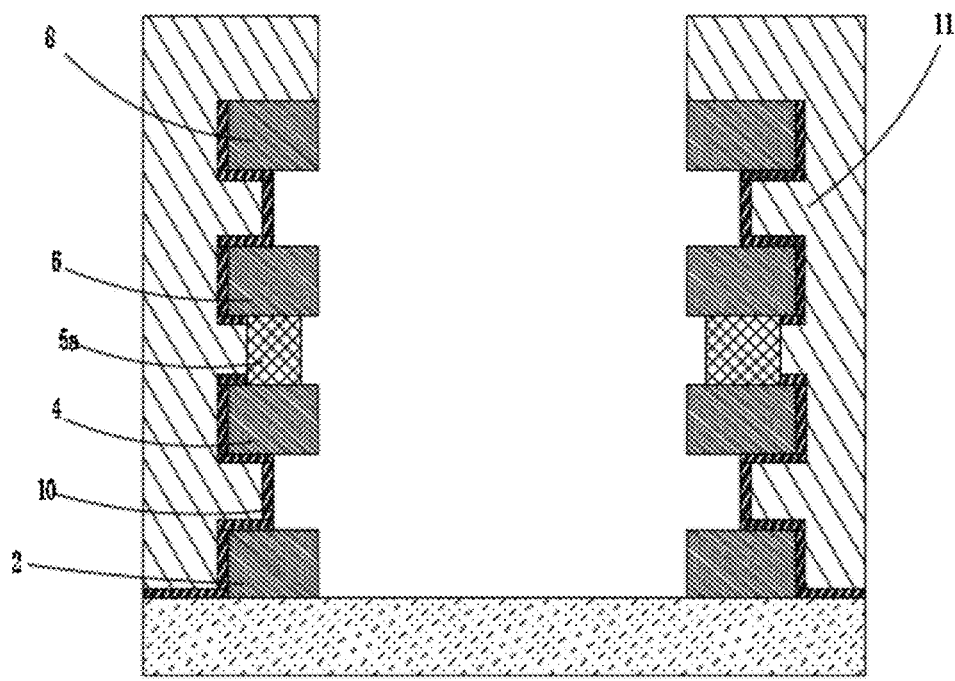

Next, step S9 is performed to remove the remaining first sacrificial layer, second sacrificial layer and third sacrificial layer (since the mask spacers used in this example are silicon oxide, they may not be removed temporarily), so as to obtain the structure as shown in FIG. 22. This step can be accomplished through step-by-step etching or one-step etching.

Step S10 is performed to form a gate dielectric layer on the sidewall and all the upper surfaces of each of the structural units. When performing this step, it is necessary to ensure that the sidewalls of the first electrode material layer, the second electrode material layer, the third electrode material layer and the fourth electrode material layer and the sidewalls of the first and second channel layers are exposed. When the gate dielectric layer is formed in this step, the gate dielectric layer covers all exposed outer surfaces (including the sidewalls).

If there are no other processes in step S9 and step S10, a silicon oxide film will be deposited on the exposed substrate surface as shown in FIG. 22 formed in step S9, and then the silicon oxide on the top and sidewalls are etched until the bottom is protected with a small thickness of silicon oxide film, which is used for isolation.

In actual device production, since various memory cells are fabricated synchronously, there are other necessary processes between step S9 and step S10, such as patterning of the upper device, fabrication of contact holes of the lower device, trench isolation, etc. For example, the following steps are included.

Figure 23:
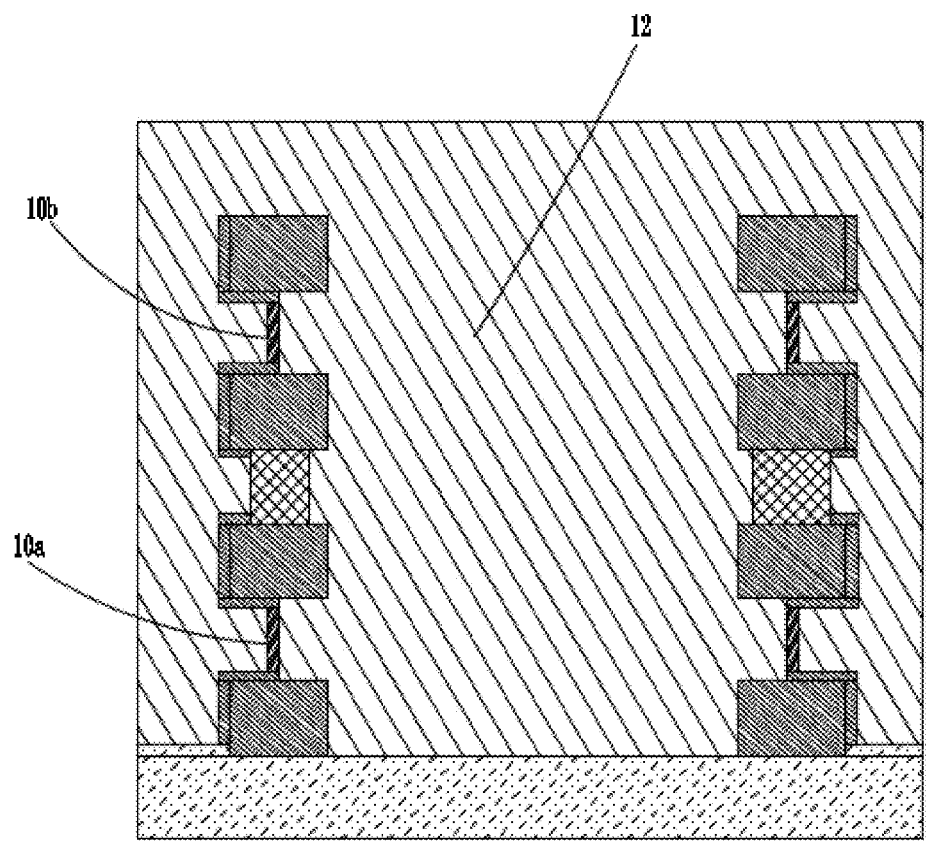

In step a1, on the basis of the structure shown in FIG. 22 obtained in step S9, a large area of silicon oxide 12 is deposited using a process such as HARP to cover all the stack structures, so as to obtain the structure shown in FIG. 23. After this step, it is appropriate to perform the high-temperature annealing process described in step S703 (as shown in FIG. 23, the material of the channel region is distinguished from the channel material of other electrode material sidewalls, thereby forming the first channel 10*a* and the second channel 10*b*).

Figure 24:
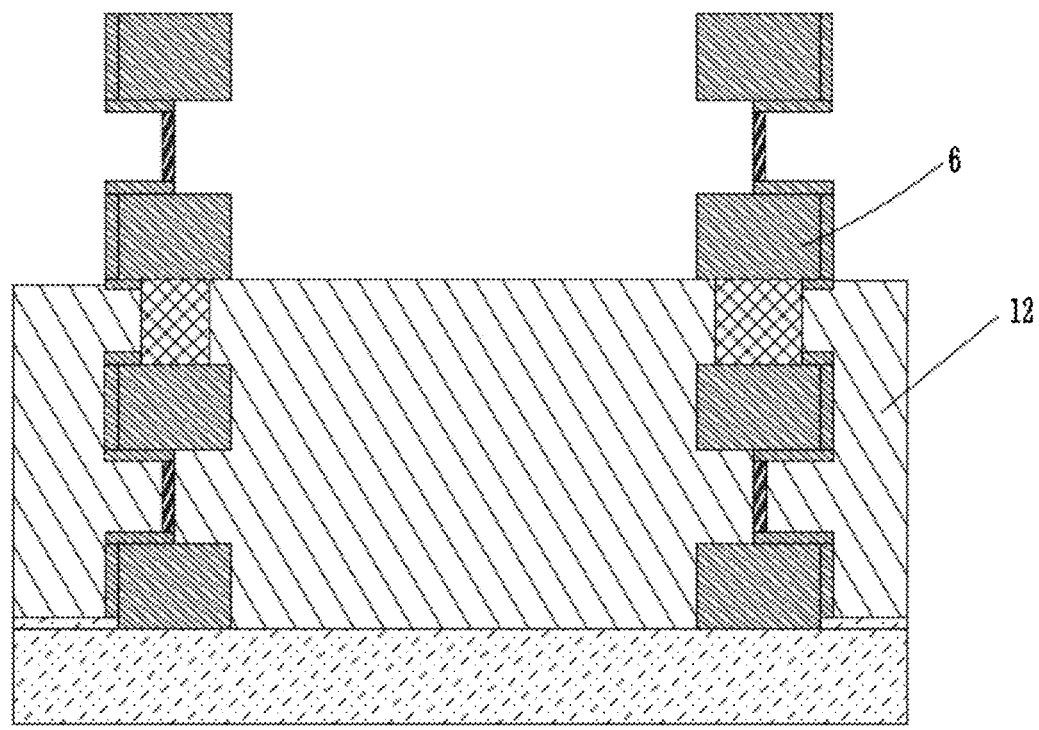

In step a2, etch the silicon oxide 12 and stop between the upper and lower devices, so as to obtain the structure shown in FIG. 24.

Figure 25:
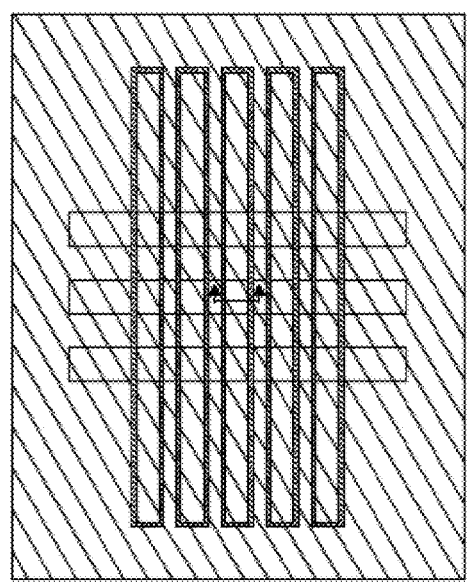
Figure 26:
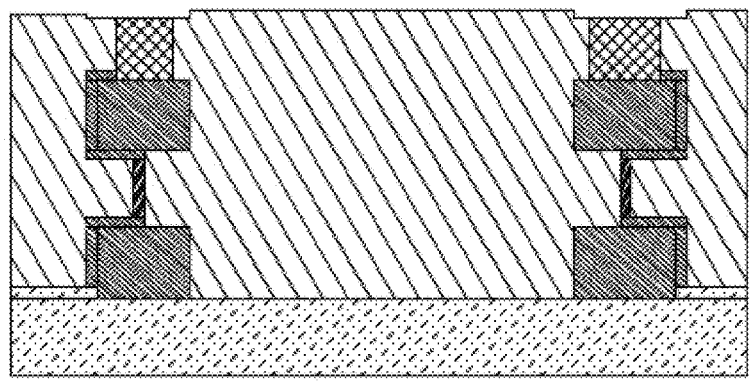

In step a3, the upper device is patterned according to a predetermined layout of the upper device; for example, according to the top-view layout shown in FIG. 25, the horizontal strips are the regions of the upper device to be etched away, and the sectional structure at the etched position is shown in FIG. 26. The purpose of this step is to cut the upper device into multiple independent units.

Figure 27:
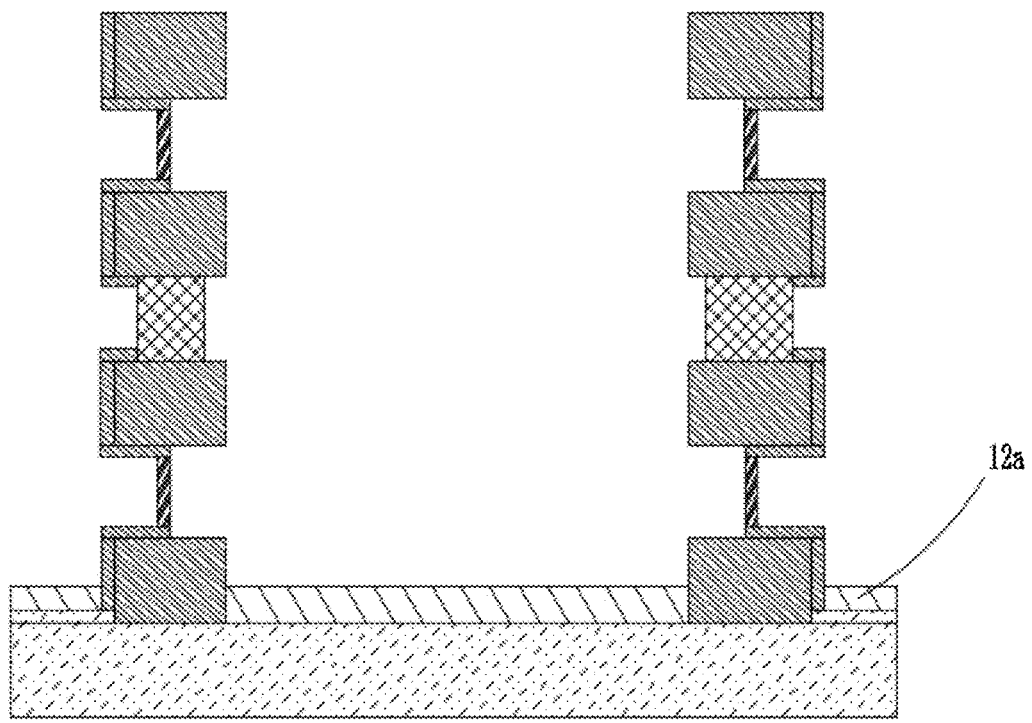

In step a4, etching of the silicon oxide is continued, leaving only a thin isolation layer 12*a* on the bottom layer to obtain the structure shown in FIG. 27 (the sectional position in FIG. 27 is the region where both the upper and lower devices are located).

Figure 28:
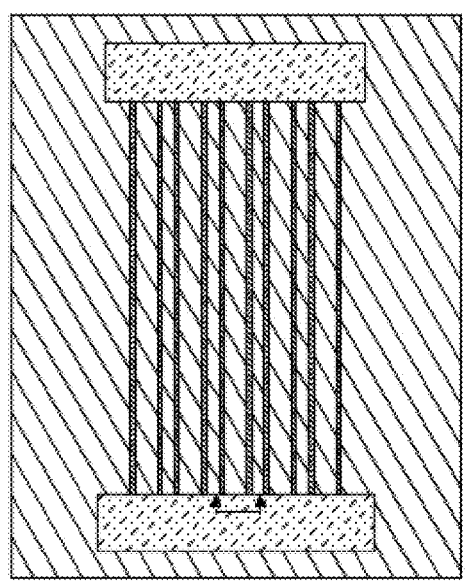
Figure 29:
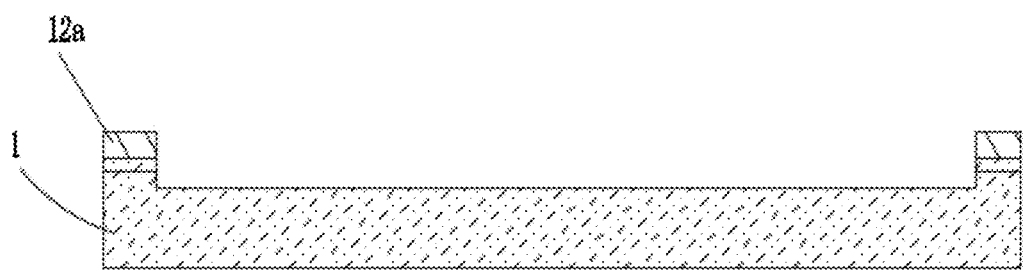
Figure 30:
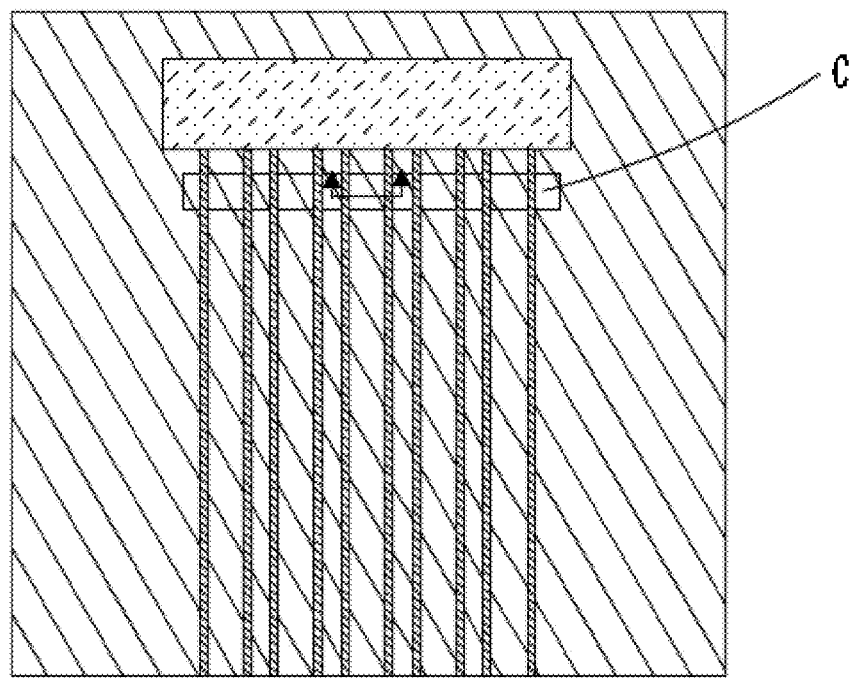

In step a5, according to the layout designed in the top view direction of FIG. 28, the ending ring device is cut off on both sides, and the sectional structure at the cutting position after cutting is shown in FIG. 29.

Figure 31:
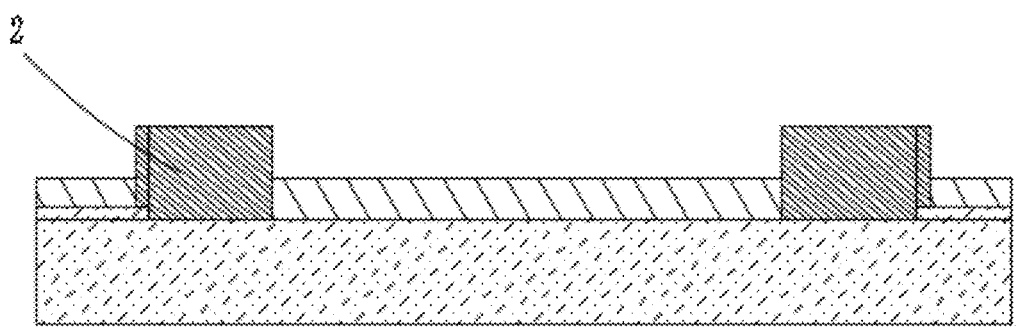
Figure 32:
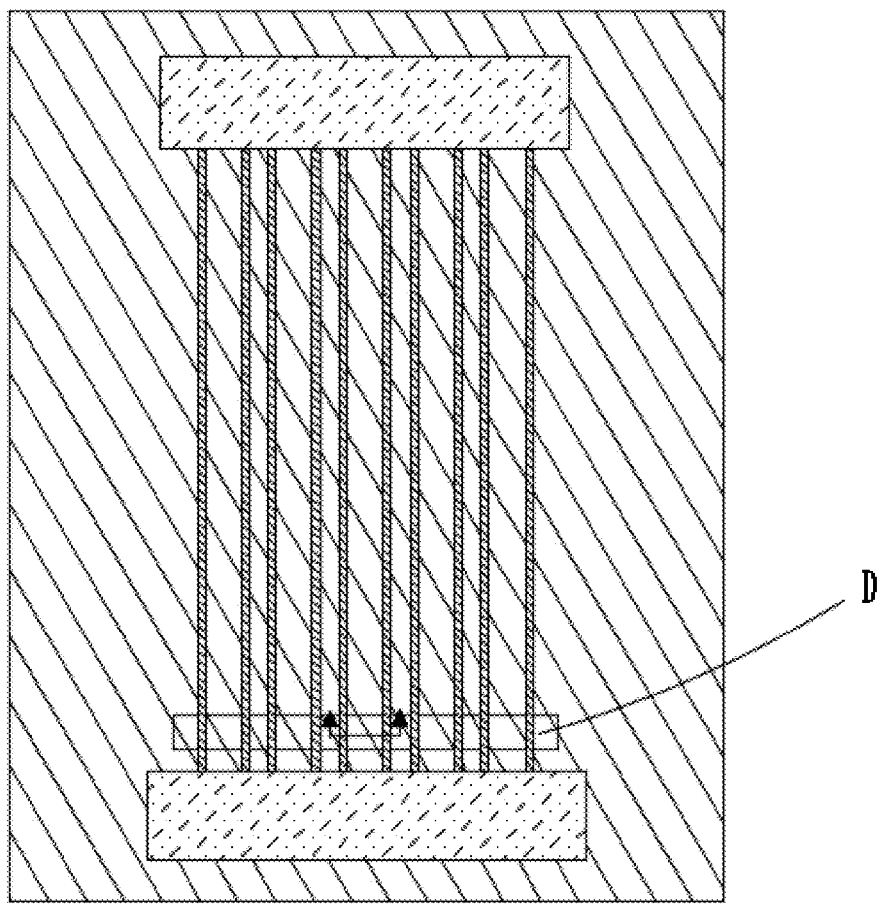
Figure 33:
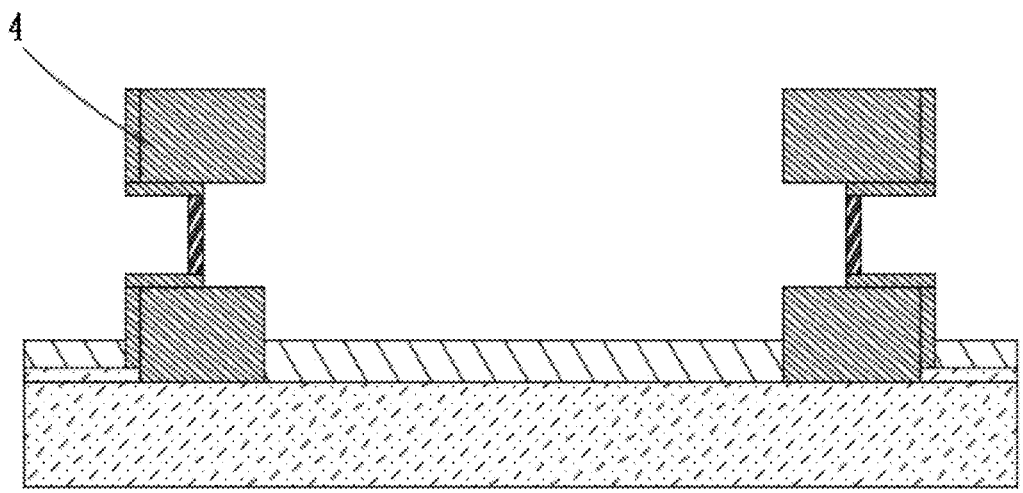

In step a6, contact holes of the lower device are formed. First, a position close to the edge of the substrate (for example, the area C marked by the second horizontal strip in the top view of FIG. 30) is selected for etching the stack structure, which stops at the first electrode material layer 2, thus serving as a landing pad for bit line contact holes of the reading transistor (the lower device). The cross-sectional structure here is shown in FIG. 31. Then at the edge of the other side (for example, the area marked by the horizontal strip near the cutting position of the lower ring device in the top view of FIG. 32), the stack structure is etched, which stops at the second electrode material layer 4, thus serving as a landing pad for word line contact holes of the reading transistor. The sectional structure here is shown in FIG. 33.

Figure 34:
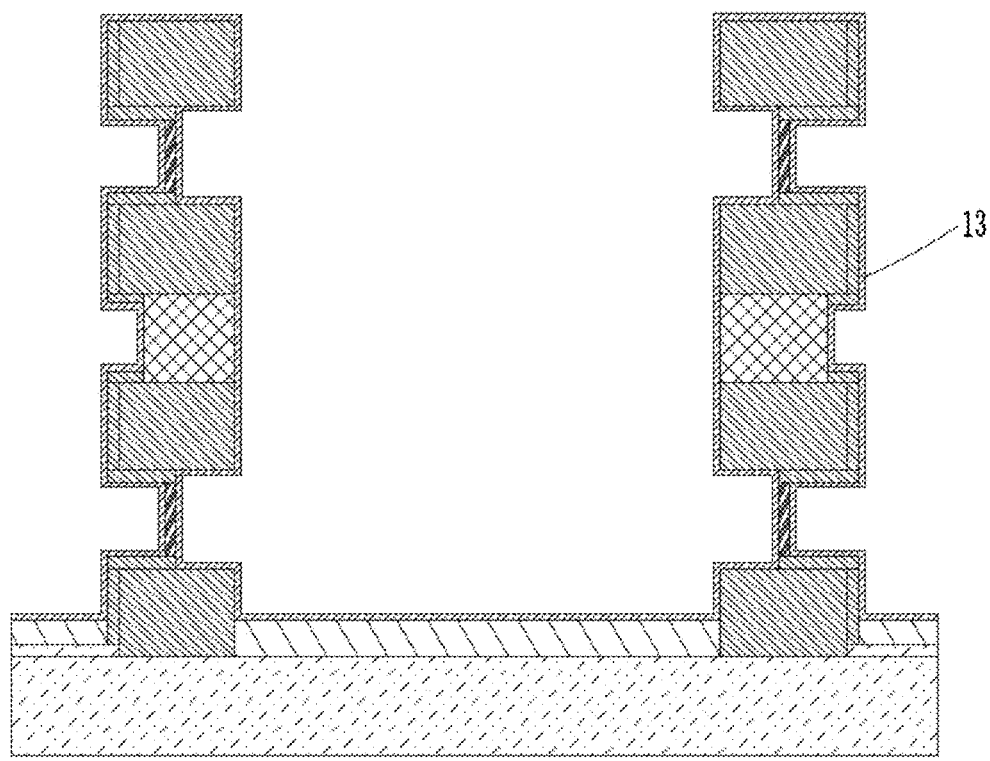

After step a6, step S10 can be performed, that is, a gate dielectric layer 13 is formed on the sidewall and all the upper surfaces of each of the structural units, as shown in FIG. 34.

Next, in step S11, the gate dielectric layer 13 is etched to expose at least part of the sidewall of the third electrode material layer in each of the structural units.

This step is to form a window on the sidewall of the drain of the upper device by etching, which is in contact with the gate of the lower device, and this step can be implemented step by step in the following manner.

In step S1101, a silicon oxide layer 14 and a bottom anti-reflection coating 15 (e.g., commonly used silicon carbide) are sequentially deposited, and the bottom anti-reflection coating is located at a position of the same height as the third electrode material layer.

Figure 35:
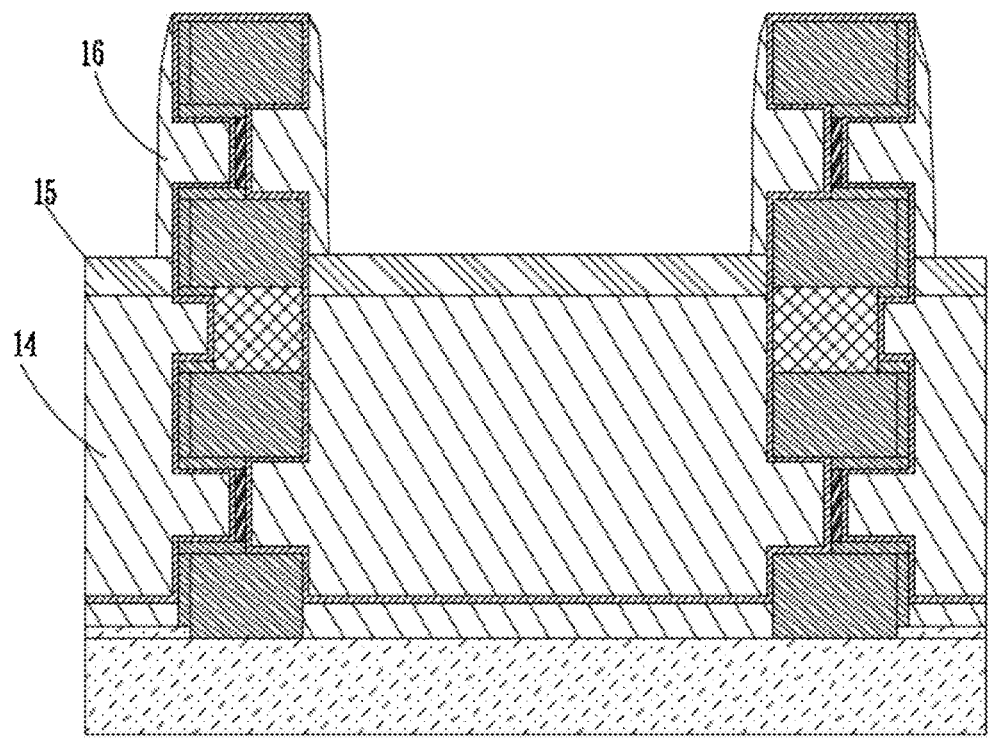

In step S1102, a silicon oxide spacer 16 is formed on the sidewall of the upper device above the bottom anti-reflection coating 15, and the structure is shown in FIG. 35.

Figure 36:
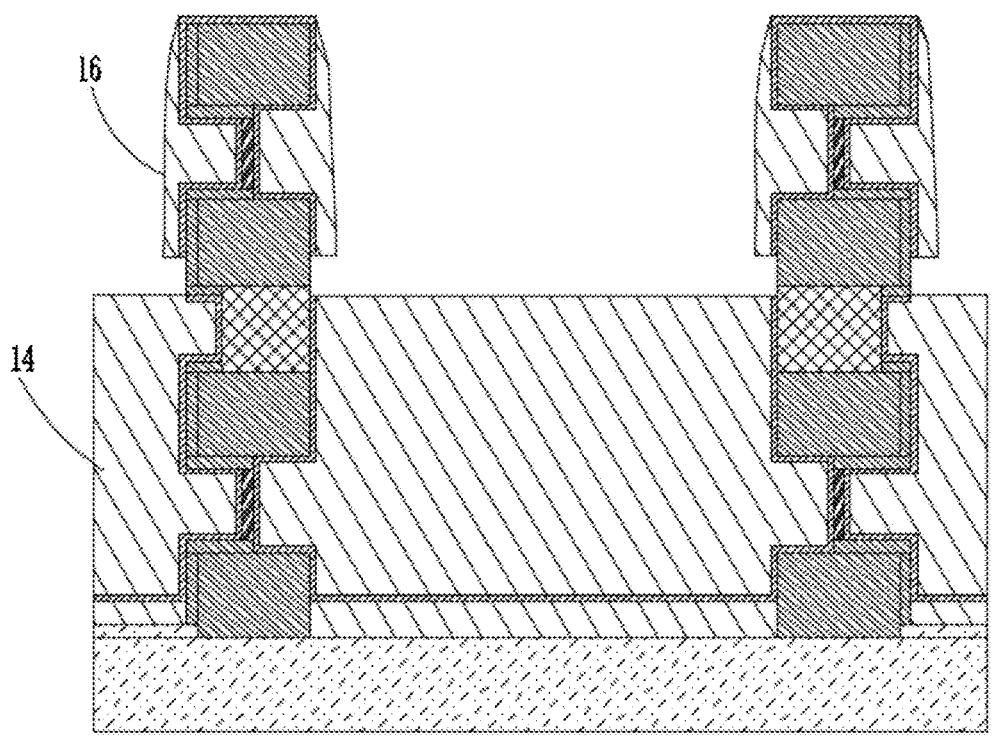

In step S1103, the bottom anti-reflection coating 15 is removed, and the structure is shown in FIG. 36.

Figure 37:
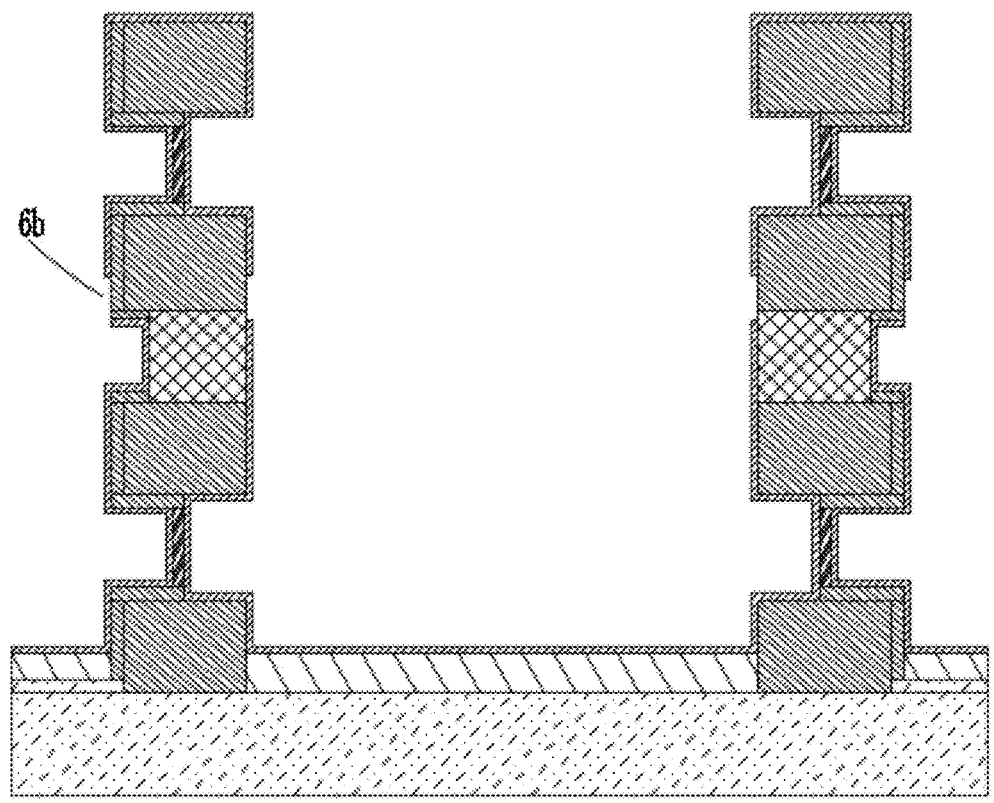

In step S1104, the gate dielectric layer is etched, thereby exposing the sidewall of the third electrode material layer to form an exposed part 6b;

In step S1105, the silicon oxide layer and the silicon oxide spacer are finally removed to obtain the structure shown in FIG. 37, which shows the exposed part 6b of the sidewall of the third electrode material layer.

Next, in step S12, a first gate layer is formed on the sidewalls of the first electrode material layer, the first channel layer and the second electrode material layer, and the first gate layer contacts the exposed sidewall of the third electrode material layer.

This step includes the following steps.

Figure 38:
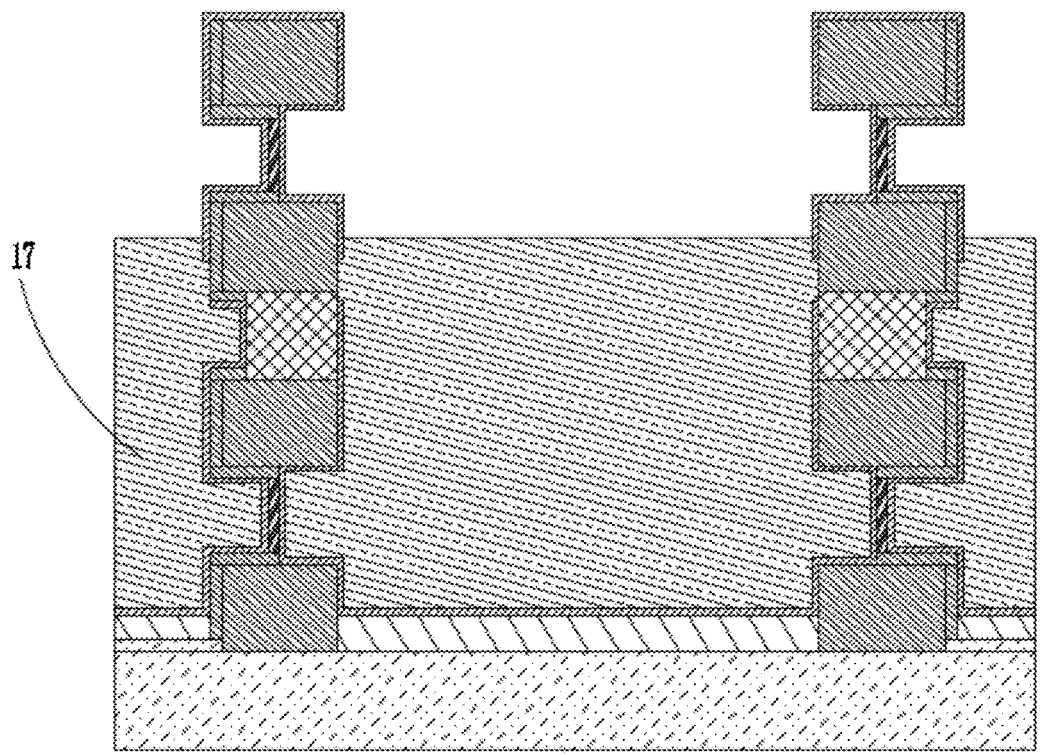

Step S1201: sputtering or depositing the first gate layer material 17 in a large area until its height is higher than the exposed sidewall of the third electrode material layer, so as to obtain the structure shown in FIG. 38.

Figure 39:
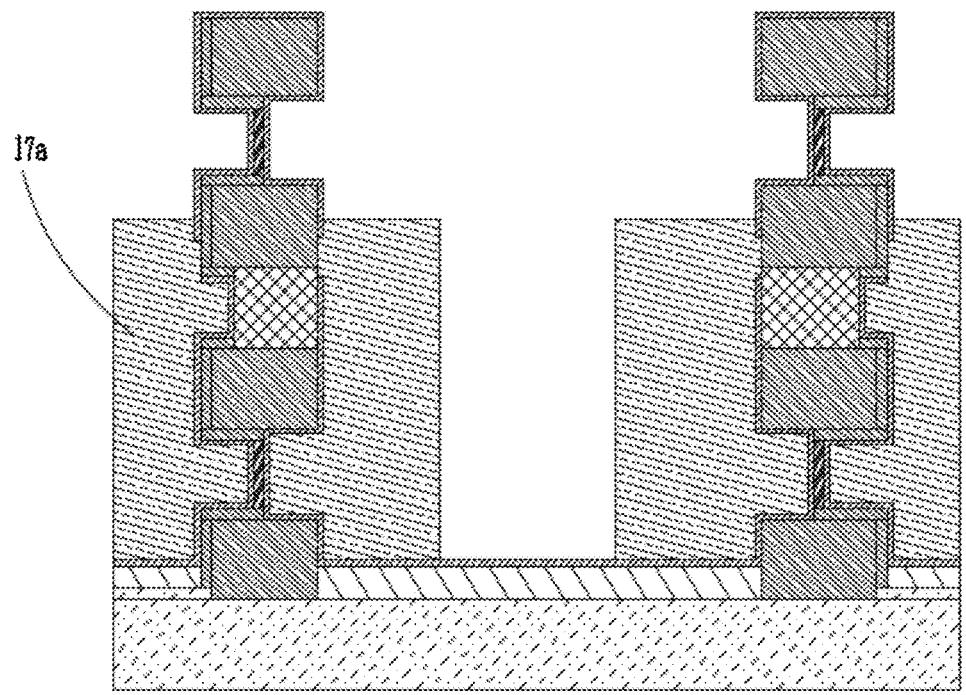

Step S1202: patterning the gate material 17 formed in the previous step (for example, usually including lateral and longitudinal etching, illustration of which is omitted herein) to match the arrangement of the upper and lower devices, so as to obtain the structure shown in FIG. 39 (this figure is only a sectional view of one of the positions, and in the sectional view of some other positions, only the substrate covered by the gate dielectric can be seen) and obtain the first gate 17a.

Figure 40:
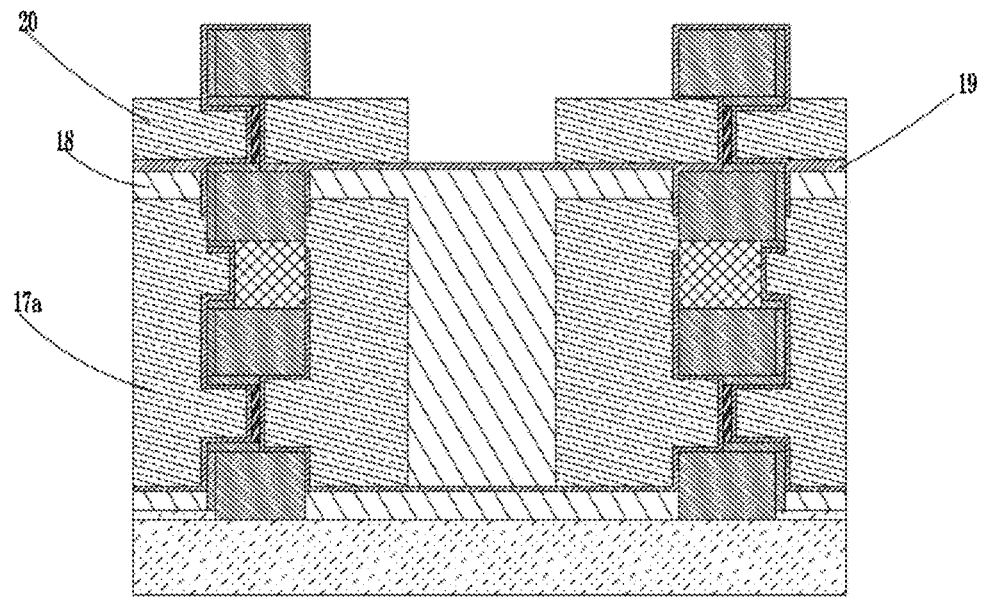

Next, in step S13, one or more layers of dielectric film are formed on the upper surface of the first gate 17a, such as a silicon oxide film 18 and a high-K dielectric film 19 as shown in FIG. 40.

Next, in step S14, a second gate layer is formed on the high-K dielectric film 19, the second gate layer covers the sidewall of the second channel layer, and the second gate layer is patterned.

Figure 41:
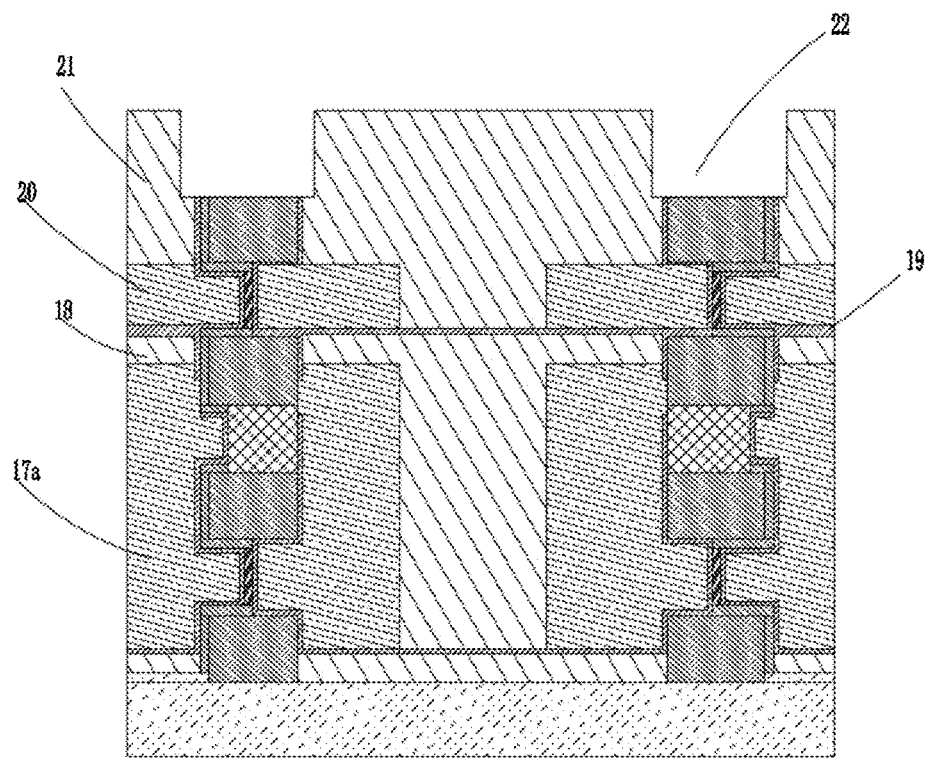

Finally, in step S15, silicon oxide 21 is filled, the surface is smoothed, and contact holes 22 of the source of the upper device are formed by etching, so as to finally obtain the structure shown in FIG. 41.

After the above steps S1 to S15, metal interconnection of the electrodes is carried out, and finally a capacitor-less DRAM memory with stacked upper and lower layers is formed. FIG. 1 shows the layout morphology of different structures in the top view of the device.

Embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art can make various substitutions and modifications, and these substitutions and modifications should all fall within the scope of the present disclosure.

The invention claimed is:

1. A semiconductor memory cell structure comprising:
a substrate; and
a first transistor layer, an isolation layer and a second transistor layer that are vertically stacked on the substrate from bottom to top;
wherein:
the first transistor layer comprises: a first stack structure formed by stacking a first source, a first channel and a first drain from bottom to top; and a first gate located on a sidewall of the first stack structure; wherein the first gate and the sidewall of the first stack structure are isolated by a gate dielectric layer, and the first gate and the substrate are isolated by the gate dielectric layer; and
the second transistor layer comprises: a second stack structure formed by stacking a second drain, a second channel and a second source from bottom to top; and a second gate located on a sidewall of the second stack structure; wherein the second gate and the sidewall of the second stack structure are isolated by the gate dielectric layer, at least a part of a sidewall of the second drain is in direct contact with the first gate, and the first gate and the second gate are isolated by a dielectric material in a vertical direction.

2. The semiconductor memory cell structure according to claim 1, wherein:
in the first transistor layer, two opposite sidewalls of the first stack structure respectively have a groove profile, and the first channel is located at the recession; and/or
in the second transistor layer, two opposite sidewalls of the second stack structure respectively have a groove profile, and the second channel is located at the recession.

3. The semiconductor memory cell structure according to claim 1, wherein in the vertical direction, the first gate and the second gate are isolated by multiple layers of dielectric material.

4. The semiconductor memory cell structure according to claim 1, wherein in the vertical direction, the first gate and the second gate are isolated by stacked silicon oxide film and high-K dielectric film.

5. The semiconductor memory cell structure according to claim 1, wherein the first gate layer and the substrate are isolated by multiple layers of dielectric material.

6. The semiconductor memory cell structure according to claim 1, wherein the first gate layer and the substrate are isolated by stacked silicon oxide film and high-K dielectric film.

7. The semiconductor memory cell structure according to claim 1, wherein:
the materials of the first source, the first drain, the second source and the second drain are doped silicon, and/or
the materials of the first gate and the second gate are independently one of titanium nitride and tungsten or a mixture of two, and/or
the gate dielectric is hafnium oxide; and/or
the materials of the first channel and the second channel are independently at least one of silicon, silicon carbide, gallium nitride, and IGZO material.

8. A semiconductor memory, comprising a plurality of the semiconductor memory cell structures according to claim 1, the plurality of the semiconductor memory cell structures being electrically connected.

9. A preparation method for a semiconductor memory cell structure, comprising the following steps:
providing a substrate;
forming a first electrode material layer, a first sacrificial layer, a second electrode material layer, a second sacrificial layer, a third electrode material layer, a third sacrificial layer, a fourth electrode material layer and a mask layer by stacking vertically on the substrate in sequence;
patterning the mask layer to form an array comprising a plurality of mask units;
forming a mask spacer on a sidewall of each mask unit;
removing structures that are not shielded by the mask units and their spacers by etching until the substrate is exposed, thereby forming a stack structure on the substrate;
then etching the first sacrificial layer, the second sacrificial layer and the third sacrificial layer in one step or step by step, so that all the three layers are partially etched from a sidewall direction, and a plurality of grooves are formed on a sidewall of the stack structure;
filling the grooves on a sidewall of the second sacrificial layer with a dielectric material to form an isolation layer for upper and lower devices, the upper device being located above the isolation layer, and the lower device being located below the isolation layer;
filling the grooves on a sidewall of the first sacrificial layer and a sidewall of the third sacrificial layer respectively with a channel material to form a first channel layer and a second channel layer respectively;
removing the mask units and the stack structure covered by them by etching, until the substrate is exposed, and retaining the structure covered by the mask spacers, so as to be divided into two structural units covered by the mask spacers;
then removing the remaining first sacrificial layer, second sacrificial layer, and third sacrificial layer and optionally removing the mask spacers;
forming a gate dielectric layer on the sidewall of each of the structural units;
etching the gate dielectric layer to expose at least part of the sidewall of the third electrode material layer in each of the structural units;
then forming a first gate layer on the sidewalls of the first electrode material layer, the first channel layer and the second electrode material layer and all upper surfaces of the structural units, wherein the first gate layer contacts the exposed sidewall of the third electrode material layer;
forming one or more layers of dielectric film on an upper surface of the first gate layer; and
forming a second gate layer on the dielectric films, wherein the second gate layer covers a sidewall of the second channel layer.

10. The preparation method for the semiconductor memory cell structure according to claim 9, wherein the first sacrificial layer, the second sacrificial layer and the third sacrificial layer are germanium-silicon layers with different germanium contents, and molar contents of germanium are ≤15%, ≥30% and ≤15%, respectively.

11. The preparation method for the semiconductor memory cell structure according to claim 9, wherein the mask layer comprises a silicon oxide layer, an amorphous silicon layer, and a silicon oxide layer stacked from bottom to top.

12. The preparation method for the semiconductor memory cell structure according to claim 11, wherein the mask spacers are silicon oxide or silicon nitride.

13. The preparation method for the semiconductor memory cell structure according to claim 10, wherein the first sacrificial layer, the second sacrificial layer and the third sacrificial layer are synchronously etched by a selective etching method to form the plurality of grooves.

14. The preparation method for the semiconductor memory cell structure according to claim 9, wherein the method of forming the isolation layer is:
depositing a dielectric material to cover all outer surfaces; and
then removing the dielectric material located on all the top surfaces and sidewalls by etching, so that the dielectric material located in the groove on the sidewall of the first sacrificial layer and the groove on the sidewall of the third sacrificial layer is completely removed, and there is still dielectric material remaining in the groove on the sidewall of the second sacrificial layer, i.e., the isolation layer.

15. The preparation method for the semiconductor memory cell structure according to claim 9, wherein before filling the channel material, the method further comprises:
laterally etching the first sacrificial layer and the third sacrificial layer to increase depths of the grooves on their sidewalls.

16. The preparation method for the semiconductor memory cell structure according to claim 12, wherein the first electrode material layer, the second electrode material layer, the third electrode material layer and the fourth electrode material layer are all epitaxially doped silicon, the channel material is at least one of silicon, silicon carbide, gallium nitride, and IGZO material, and the mask layer comprises a silicon oxide layer on the top.

17. The preparation method for the semiconductor memory cell structure according to claim 16, wherein:
the channel material is silicon, the first sacrificial layer, the second sacrificial layer and the third sacrificial layer are all epitaxially formed, and the method of filling the channel material is: epitaxially growing the channel material; and
after the channel material is filled, high-temperature annealing is performed on the first electrode material layer, the second electrode material layer, the third electrode material layer and the fourth electrode material layer, or the epitaxial channel material located on the sidewalls of the first electrode material layer, the second electrode material layer, the third electrode material layer and the fourth electrode material layer is removed.

18. The preparation method for the semiconductor memory cell structure according to claim 9, wherein before the step of removing the mask units and the stack structure covered by them by etching, the method further comprises:
depositing an isolation material to cover the outer surface.

19. The preparation method for the semiconductor memory cell structure according to claim 18, wherein after removing the remaining first sacrificial layer, the second sacrificial layer and the third sacrificial layer and before forming the gate dielectric layer, the method further comprises:
patterning the upper device, and etching the isolation material until the thickness reaches the extent of covering a part of the sidewall of the first electrode material layer; and/or
forming contact holes of the first electrode material layer and contact holes of the second electrode material layer in the lower device by etching.

20. The preparation method for the semiconductor memory cell structure according to claim 9, wherein the method of exposing at least part of the sidewall of the third electrode material layer in each of the structural units is:
depositing a silicon oxide layer and a bottom anti-reflection coating in sequence, wherein the bottom anti-reflection coating is located at a position of the same height as the third electrode material layer;
then forming a silicon oxide spacer on the sidewall of the upper device above the bottom anti-reflection coating;
then removing the bottom anti-reflection coating, and etching the gate dielectric layer, thereby exposing the sidewall of the third electrode material layer; and
finally removing the silicon oxide layer and the silicon oxide spacer.

21. The preparation method for the semiconductor memory cell structure according to claim 9, wherein the method of forming the first gate layer comprises:
depositing a gate material until the height is higher than the exposed sidewall of the third electrode material layer, and then patterning the gate material.

22. The preparation method for the semiconductor memory cell structure according to claim 9, wherein the multiple layers of dielectric film formed on the upper surface of the first gate layer comprise a silicon oxide film and a high-K dielectric film.

23. The preparation method for the semiconductor memory cell structure according to claim 9, wherein after forming the second gate layer, the method further comprises:
depositing a dielectric film, and forming contact holes of the upper device by etching; and/or
performing metal interconnection on the contact holes of the lower device and the contact holes of the upper device, respectively.

* * * * *